(12) United States Patent
Tada et al.

(10) Patent No.: US 8,796,659 B2
(45) Date of Patent: Aug. 5, 2014

(54) VARIABLE RESISTANCE ELEMENT, SEMICONDUCTOR DEVICE INCLUDING VARIABLE RESISTANCE ELEMENT, AND METHODS FOR MANUFACTURING VARIABLE RESISTANCE ELEMENT AND SEMICONDUCTOR DEVICE

(75) Inventors: Munehiro Tada, Tokyo (JP); Koichiro Okamoto, Tokyo (JP); Toshitsugu Sakamoto, Tokyo (JP); Hiromitsu Hada, Tokyo (JP)

(73) Assignee: NEC Corporation, Tokyo (JP)

( * ) Notice: Subject to any disclaimer, the term of this patent is extended or adjusted under 35 U.S.C. 154(b) by 130 days.

(21) Appl. No.: 13/635,858

(22) PCT Filed: Mar. 16, 2011

(86) PCT No.: PCT/JP2011/056302
§ 371 (c)(1),
(2), (4) Date: Sep. 18, 2012

(87) PCT Pub. No.: WO2011/115188
PCT Pub. Date: Sep. 22, 2011

(65) Prior Publication Data
US 2013/0009123 A1    Jan. 10, 2013

(30) Foreign Application Priority Data
Mar. 19, 2010    (JP) .................................. 2010-064689

(51) Int. Cl.
*H01L 29/04*    (2006.01)
(52) U.S. Cl.
USPC .... 257/3; 257/2; 257/E45.002; 257/E45.003; 438/382

(58) Field of Classification Search
CPC .. H01L 45/085; H01L 45/145; H01L 45/1616
USPC ............ 257/2, 3, E45.002, E45.003; 438/382
See application file for complete search history.

(56) References Cited

U.S. PATENT DOCUMENTS

| 7,539,038 B2 | 5/2009 | Lee et al. |
| 7,612,358 B2 | 11/2009 | Joo et al. |

(Continued)

FOREIGN PATENT DOCUMENTS

| JP | 2006-222428 A | 8/2006 |
| JP | 2006-261677 A | 9/2006 |

(Continued)

OTHER PUBLICATIONS

Shunichi Kaeriyama et al., A Nonvolatile Programmable Solid-Electrolyte Nanometer Switch, IEEE Journal of Solid-State Circuits, Jan. 2005, pp. 168-176, vol. 40, No. 1.

(Continued)

*Primary Examiner* — William F Kraig
*Assistant Examiner* — Joseph C Nicely
(74) *Attorney, Agent, or Firm* — Foley & Lardner LLP

(57) ABSTRACT

A variable resistance element includes a first electrode, a second electrode and an ion conduction layer interposed between the first and second electrodes. The ion conduction layer contains an organic oxide containing at least oxygen and carbon. The carbon concentration distribution in the ion conduction layer is such that the carbon concentration in an area closer to the first electrode is greater than that in an area closer to the second electrode.

20 Claims, 11 Drawing Sheets

(56) References Cited

U.S. PATENT DOCUMENTS

| | | | |
|---|---|---|---|
| 7,777,212 B2 | 8/2010 | An et al. | |
| 7,829,885 B2 | 11/2010 | Joo et al. | |
| 2005/0285095 A1* | 12/2005 | Happ | 257/2 |
| 2006/0049390 A1* | 3/2006 | Ufert et al. | 257/4 |
| 2008/0093709 A1* | 4/2008 | Matsuura et al. | 257/632 |
| 2010/0133501 A1 | 6/2010 | Sakamoto et al. | |
| 2010/0327253 A1* | 12/2010 | Nakai et al. | 257/4 |
| 2011/0014744 A1 | 1/2011 | Joo et al. | |
| 2012/0280200 A1* | 11/2012 | Tada et al. | 257/4 |
| 2013/0037773 A1* | 2/2013 | Strukov et al. | 257/2 |

FOREIGN PATENT DOCUMENTS

| | | |
|---|---|---|
| JP | 2007-208258 A | 8/2007 |
| JP | 2008-182234 A | 8/2008 |
| WO | WO 2007/114099 A1 | 10/2007 |

OTHER PUBLICATIONS

M. Tada et al., Highly Scalable Nonvolatile TiOx/TaSiOy Solid-electrolyte Crossbar Switch Integrated in local Interconnect for Low Power Reconfigurable Logic, IEEE International Electron Devices Meeting, 2009, pp. 943-946.

* cited by examiner

VARIABLE RESISTANCE ELEMENT, SEMICONDUCTOR DEVICE INCLUDING VARIABLE RESISTANCE ELEMENT, AND METHODS FOR MANUFACTURING VARIABLE RESISTANCE ELEMENT AND SEMICONDUCTOR DEVICE

TECHNICAL FIELD

CROSS-REFERENCE TO RELATED APPLICATIONS

This application is the National Phase of PCT/JP2011/056302, filed Mar. 16, 2011, and claims the benefit of the priority of Japanese patent application No. 2010-064689 filed on Mar. 19, 2010, the disclosures of which are incorporated herein in their entirety by reference thereto.

This disclosure relates to a variable resistance element, a semiconductor device inclusive of the variable resistance element, and methods for manufacturing the variable resistance element and the semiconductor device. More particularly, it relates to a semiconductor device in which there are loaded a memory including a variable resistance non-volatile element, referred to below as a variable resistance element, and a field programmable gate array (Field Programmable Gate Array and FGPA) within a multilevel interconnect layer structure, the variable resistance element, and to the methods for manufacturing the semiconductor device and the variable resistance element.

BACKGROUND

As the scaling rule, known from the Moor's law, is becoming more miniscule, the integration degree of semiconductor devices, including silicon devices, is becoming progressively higher, while their power consumption is becoming progressively lower. The semiconductor devices have been developed at a pace of four times in three years in terms of the degree of integration. Recently, the gate length of a MOSFET (Metal Oxide Semiconductor Field Effect Transistor) is 20 nm or less. Due to rise in the cost of the lithographic process and physical limitation placed on the device size, a need is felt to improve the device performance by an approach different from the conventional approach founded on the scaling rule.

The rise in the cost of the lithographic process may be said to be attributable to rise in the costs of manufacturing apparatus and the mask set. Among the physical limitations in the device size, there are the limitations in the operation and the limitations in the dimensional variations.

Recently, a rewritable programmable logic device, termed FPGA, has been developed. FPGA is regarded to be at an intermediate position between a gate array and a standard cell. The FPGA allows a customer to configure a circuit as he/she desires after manufacture of the device. The FPGA includes a variable resistance element in the inside of a multilevel interconnection structure to allow the customer to make electrical connections of interconnects as he/she desires. The circuit may be improved in the degree of freedom with the use of the semiconductor device carrying the FPGA. The variable resistance element may be enumerated by ReRAM (Resistance RAM (Random Access Memory)) and NanoBridge (registered trademark of NEC Corporation, the assignee company) that uses an ion conductor. It is noted that the ion conductor is a solid substance in which ions may move freely on application of, for example, an electrical field.

Non-Patent Literature 1 discloses, as a variable resistance element that is likely to improve the degree of freedom of an electrical circuit, a switching element making use of an electrochemical reaction and metal ion mobility in the ion conductor. The switching element disclosed in Non-Patent Literature 1 is composed by three layers, viz., an ion conduction layer and first and second electrodes provided in contact with two sides of the ion conduction layer. It is noted that, while the first electrode performs the role of supplying metal ions to the ion conduction layer, there are no metal ions supplied from the second electrode.

The operation of the switching element will now be briefly described. When the first electrode is grounded and a negative voltage is applied to the second electrode, metals of the first electrode are turned into metal ions and are dissolved in the ion conduction layer. The metal ions in the ion conduction layer are precipitated as metal in the ion conduction layer. The so precipitated metal forms metal crosslink(s) that interconnects the first and second electrodes. With the metal crosslink(s) electrically interconnecting the first and second electrodes, the switch is turned to an on-state.

Conversely, if, in the above mentioned on-state, the first electrode is grounded and the positive voltage is applied to the second electrode, part of the metal crosslink(s) is severed. This breaks the electrical connection between the first and second electrodes, so that the switch is turned off. Note that, as from the stage before complete breakage of the electrical connection, the electrical characteristic is changed. For example, the resistance between the first and second electrodes increases, or the capacity between the electrodes is varied. Ultimately, the electrical connection is turned to an off-state. In case the on-state is to be re-established from such off-state, it is sufficient that the first electrode again is grounded and a negative voltage is applied to the second electrode.

Non-Patent Literature 2 discloses a construction and an operation of a two-terminal switching element in which two electrodes are arranged via an ion conductor and which controls the state of conduction through these electrodes.

These switching elements feature a size and an on-resistance smaller than those of the semiconductor switch, such as MOSFET, and hence the application of the switching elements to a programmable logic device is felt to be promising. In addition, in these switching elements, the state of conduction (on- or off-state of the elements) may be maintained as it is without voltage application. Hence, the switching elements may possibly be used as non-volatile memory devices.

For example, a memory cell composed by a transistor selection element and a transistor switching element is arranged as a basic unit to form a volatile memory. A plurality of the memory cells is arranged in each of the longitudinal and transverse directions to form a plurality of word lines and a plurality of bit lines. Arbitrary one of the memory cells may be selected by these word lines and bit lines. The state of conduction of the switching element of the selected memory cell is sensed. From the on/off state of the switching element, it is possible to read out which of the information '1' and the information '0' is stored in the so selected memory cell.

In the Patent Literatures 1-3, there are also disclosed nano-channel switching elements or memory elements.

PTL 1:
WO2007/114099
PTL 2:
JP Patent Kokai Publication No. JP2006-222428A
PTL 3:
JP Patent Kokai Publication No. JP2006-261677A

NPL 1:

Shunichi Kaerimiya et al., "A Nonvolatile Programmable Solid-Electrolyte Nanometer Switch", IEEE Journal of Solid-State Circuits, Vol. 40, No. 1, pp. 168-176, January 2005

Non-Patent Literature 2:

M. Tada, T. Sakamoto, Y. Tsuji, N. Banno, Y. Saito, Y. Yabe, S. Ishida, M. Terai, S. Kotsuji, N. Iguchi, M. Aono, H. Hada and N. Kasai, "Highly Scalable Nonvolatile TiOx/TaSiOy Solid-electrolyte Crossbar Switch Integrated in Local Interconnect for Low Power Reconfigurable Logic", IEEE International Electron Devices Meeting (2009, Baltimore, USA), pp. 943-946 (2009)

SUMMARY

The entirety of the contents disclosed in the above mentioned Patent Literatures 1 to 3 and in the Non-Patent Literatures 1 and 2 is incorporated herein by reference.

The following analysis is made by the present disclosure.

It has been recognized that, in case an element making use of copper and the ion conduction layer, such as NanoBridge (registered trademark), is used as a variable resistance element, the component material of the ion conduction layer significantly affects the switching characteristic. With the use of oxides, such as $Ta_2O_5$ or TaSiO, as the component material of the ion conduction layer, the switching voltage can be made 1V or more, and the variable resistance element can be loaded on logic products.

However, in the conventional ion conduction layer, in which the film density is pre-set at a constant value, metal-ion recovery (restoration) from the ion crosslinks, formed throughout the inside of the ion conduction layer, can be conducted only insufficiently when the element is switched from the low resistance state to the high resistance state. As a result, leakage current is produced.

The conventional ion conduction layer can be formed by a PVD (Physical Vapor Deposition) method or by a plasma CVD (Chemical Vapor Deposition) method. In the PVD method, the lower Cu electrode is oxidized by oxide sputtering. In the plasma CVD method, a constant RF power is applied to the shower head. Thus, when the plasma is ignited, the lower Cu electrode is oxidized by oxygen plasma decomposed from the starting feedstock material, thus forming CuO. The leakage current is increased due to Cu in CuO being thermally diffused into the ion conduction layer due to heat hysteresis in the process.

The present disclosure has been made aiming at solving the above mentioned problem inherent in the conventional technique. It is an object of the present disclosure to provide a variable resistance element, a semiconductor device and a method for forming the variable resistance element, according to which the leakage current may be reduced while the low voltage operation is maintained.

In a first aspect of the present disclosure, a variable resistance element includes first and second electrodes and an ion conduction layer interposed between the first and second electrodes. The ion conduction layer comprises an organic oxide containing at least oxygen and carbon. The carbon concentration distribution in the ion conduction layer is such that the carbon concentration in an area of the ion conduction layer closer to the first electrode is greater than that in an area thereof closer to the second electrode.

In a second aspect of the present disclosure, a semiconductor device includes the above mentioned variable resistance element.

In a third aspect of the present disclosure, a method for manufacturing a variable resistance element having a layered structure of a first electrode, an ion conduction layer containing an organic oxide, and a second electrode, layered in this order, comprises a plasma CVD process for forming the ion conduction layer containing the organic oxide. The plasma CVD process employs a vapor of an organic silica compound and an inert gas for dilution. The organic silica compound includes a skeleton composed by at least silicon, carbon and oxygen. The plasma CVD process includes varying, either gradually or stepwise, the high frequency power for plasma ignition or the partial pressure of the vapor of the organic silica compound supplied, as from the time of plasma ignition.

Since the area of the ion conduction layer closer to a lower electrode is reduced in density due to the increased carbon concentration, the rate of ion conduction becomes faster. Thus, when the variable resistance element transitions from an ON state to an OFF state, it is possible to readily recover metal-ions from metal crosslinks (i.e. restore from crosslinks), thereby reducing the leakage current.

On the other hand, due to the structure in which oxidation of the lower electrode is suppressed, it is possible to decrease the leakage current ascribable to metal oxide being formed on the electrode during CVD plasma processing.

PREFERRED MODES

Figure 1:
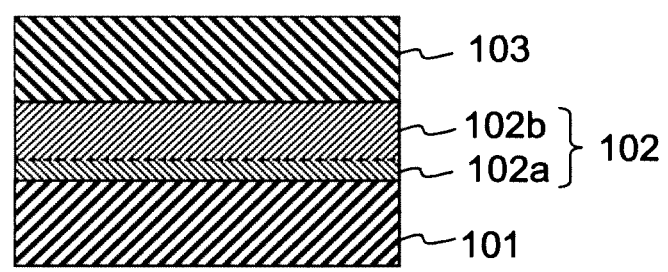
FIG. 1 is a schematic cross-sectional view of an example of a basic structure of a variable resistance element according to the present disclosure.

In the first aspect, the above mentioned carbon concentration distribution in the ion conduction layer is preferably decreased continuously or stepwise from the first electrode side towards the second electrode side.

The above mentioned ion conduction layer is preferably a film containing at least silicon as element in addition to oxygen and carbon.

The above mentioned ion conduction layer is preferably a film containing an organic matter including a siloxane structure composed by a six-membered or eight-membered ring, as main skeleton.

The above mentioned organic matter preferably further includes at least an unsaturated hydrocarbon group.

The above mentioned ion conduction layer is preferably a porous film.

The above mentioned ion conduction layer preferably has a dielectric constant not less than 2.5 and not greater than 3.5.

The above mentioned first electrode preferably comprises copper.

Preferably, a titanium oxide layer is interposed between the ion conduction layer and copper which forms the above mentioned first electrode. Also preferably, the ion conduction layer contains titanium.

Preferably, the second electrode comprises ruthenium.

In the third aspect, the above mentioned organic silica compound is preferably a cyclic organic silica compound including a skeleton composed by silicon, carbon and oxygen.

Preferably, the organic silica compound is a cyclic organic silica compound including a skeleton composed by silicon, carbon and oxygen, with at least one unsaturated hydrocarbon group attached to its side chain.

The above mentioned organic silica compound preferably includes a structure shown by one of the chemical formulas [Chemical Formula 1] and [Chemical Formula 2], in which each of R1 and R2 is one selected from hydrogen, a methyl group, an ethyl group, a propyl group, an isopropyl group and a vinyl group.

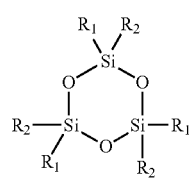

[Chemical Formula 1]

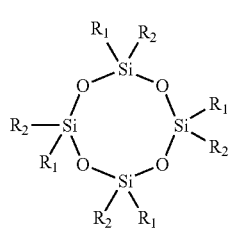

[Chemical Formula 2]

Preferably, the above mentioned organic silica compound has a chemical structure shown by one of the following chemical formulas [Chemical Formula 3] to [Chemical Formula 7].

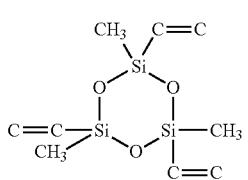

[Chemical Formula 3]

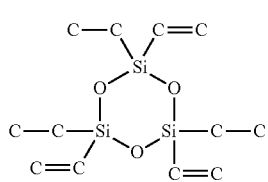

[Chemical Formula 4]

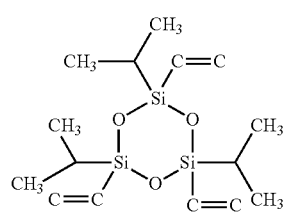

[Chemical Formula 5]

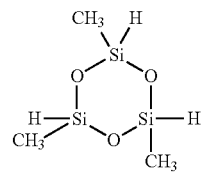

[Chemical Formula 6]

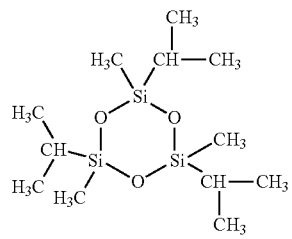

[Chemical Formula 7]

Preferably, the above mentioned organic silica compound includes a chemical structure shown by one of the chemical formulas [Chemical Formula 8], [Chemical Formula 9] and [Chemical Formula 10].

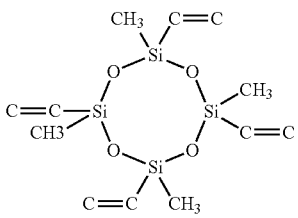

[Chemical Formula 8]

[Chemical Formula 9]

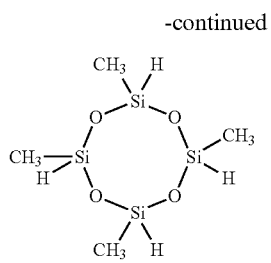

[Chemical Formula 10]

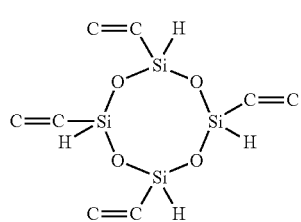

Preferably, a step of forming a valve metal film on the first electrode is included before the above mentioned step of forming the ion conduction layer, and the step of forming the ion conduction layer includes a concurrent step of oxidizing metal contained in the valve metal film.

Preferably, the first electrode comprises copper, the valve metal film comprises titanium and the second electrode comprises ruthenium.

Several exemplary embodiments will now be explained in detail in connection with a variable resistance element according to the present disclosure, a semiconductor device that makes use of the variable resistance element, and the manufacturing methods therefor. The variable resistance element in an exemplary embodiment of the present disclosure has a structure in which a first electrode, an insulation film containing at least oxygen and carbon (ion conduction layer), and a second electrode, layered in this order.

The present inventors conducted perseverant researches in connection with a voltage to form metal crosslinks within the ion conduction layer, and with the component material of the ion conduction layer. As a result of these researches, the present inventors arrived at the information that the lower the density of the ion conduction layer, the lower may be the forming voltage for forming the initial crosslinks.

Based on this information, the present inventors have found that, by using, in a variable resistance element according to an exemplary embodiment of the present disclosure, an insulation film containing at least oxygen and carbon as an ion conduction layer, crosslinks by metal ions formed in the ion conduction layer may be formed with ease to allow decreasing the forming voltage.

If, as a technique of decreasing the density of the insulation film, operating as the ion conduction layer, a film containing SiO as skeleton is to be formed, admixing carbon (C) into the film is effective. The density of the insulation film may be decreased by introducing, into the film, a compound containing an alkyl group, such as a methyl group or ethyl group, or an alkane chain including e.g., a vinyl group, representing an interlinked state in the film.

In such method for forming the ion conduction layer, mainly composed of SiOC, a plasma CVD (Chemical Vapor Deposition) method, making use of an organic siloxane starting feedstock material, may be used. However, this may raise a problem that copper in the lower electrode (first electrode) is oxidized by oxygen ions derived from the starting feedstock material decomposed in the plasma. The present inventors have found that such oxidation may be suppressed by setting the RF power during the plasma initiation process at a lower value and by increasing the RF power continuously or stepwise during the plasma maintaining process.

The present inventors also have found that the resistance at the time of resetting may be increased by forming a gradient in the carbon concentration in the ion conduction layer in the present exemplary embodiment. This results from the fact that, by increasing the carbon concentration in the area of the ion conduction layer towards copper (lower electrode), the ion conduction rate may be increased to provide for facilitated metal-ion recovery from the crosslinks at the time of resetting. By so doing, residual copper in the ion conduction layer may be decreased, as a result of which it becomes possible to decrease the leakage current in the variable resistance element.

On the other hand, an oxide film of valve metal, such as a titanium oxide film, may be formed on a copper electrode. In this case, oxidation of copper in the lower layer may be suppressed to a greater extent by the oxide film of the valve metal. This is due to the fact that the valve metals, such as titanium (Ti) or aluminum (Al), the form of an oxide, has a greater standard free energy in the negative direction than that of copper. Hence, the valve metal performs the role of absorbing oxygen generated in the course of forming the ion conduction layer, that is, the role of becoming a valve metal, thus forming a valve metal oxide film.

The valve metal is a metal that prevents copper from being oxidized, and may be enumerated by tantalum, niobium, hafnium, zirconium, zinc, tungsten, bismuth and antimony, besides Ti and Al. Although the valve metal here is used as a metal to prevent copper from becoming oxidized, it may also be used for preventing oxidation of metals other than copper.

By forming the structure of the ion conduction layer according to the present disclosure on the valve metal oxide, the carbon concentration in the ion conduction layer and the valve metal is increased. This allows reducing the oxidation of the valve metal and hence reducing the film thickness of the valve metal.

Part of the valve metal is thermally diffused into the inside of the ion conduction layer by heat hysteresis of the downstream side process. However, the so diffused valve metal forms an alloy with copper during the time of forming metal crosslinks, thus effectively improving stability in the metal crosslinking. In case the ion conduction layer area towards copper is rich in carbon content and valve metal volume, while the ion conduction layer area towards the opposite electrode is not, stability in the metal crosslinks and that in the switching operation may be accomplished in combination.

A porous film is preferably used as an ion conduction layer. In the course of experiments to arrive at the present disclosure, the present inventors have also found that, if, in forming the porous film, a six- or eight-membered cyclic siloxane structure having silicon and oxygen as skeleton is contained in the film, copper is able to make exit or entrance really by using the inside of the ring. Hence, the on/off operation as the variable resistance element may occur more readily.

The porous film may be formed using a cyclic organic silica compound to the side chain of which at least one unsaturated hydrocarbon group is linked. In this case, the insulation film may be allowed to grow while the decomposition reaction of the starting feedstock material is suppressed. Thus, in forming the porous film on the copper electrode, for example, it is possible to form the porous film while copper oxidation is suppressed. Moreover, the insulation film can be formed as the cyclic siloxane skeleton of the starting feedstock material is maintained. Hence, an insulation film including a six-membered or eight-membered cyclic siloxane structure may be obtained to advantage, such that carbon may be left in the porous film more readily.

Moreover, the porous film may be formed on the first electrode by using the plasma CVD method in which a mixed gas composed by a vapor of the cyclic organic silica compound and a vapor of the inorganic gas is supplied to the first electrode. It is noted that the cyclic organic silica compound contains silicon and oxygen as skeleton and at least one unsaturated hydrocarbon group is linked to its side chain.

Certain exemplary embodiments of the present disclosure will now be described in detail.

(Exemplary Embodiment 1) Method For Forming An Ion Conduction Layer

A semiconductor device (variable resistance element) according to an exemplary embodiment of the present disclosure will now be described with reference to the drawings. FIG. 1 depicts a schematic cross-sectional view showing an example configuration of a semiconductor device according to the exemplary embodiment.

Referring to FIG. 1, the semiconductor device of the present exemplary embodiment includes a first electrode 101, a porous film 102 and a second electrode 103. The porous film 102 and the second electrode 103 are formed in this order on the first electrode 101. The first electrode 101 is mainly composed of metals, with copper being a principal component. The porous film 102 contains elements silicon (Si), oxygen (O) and carbon (C) as component materials.

The first electrode 101 and the second electrode 103 of the semiconductor device of the present exemplary embodiment will now be described. The first electrode 101 is metallic and contains copper. The first electrode 101 performs the role of supplying copper ions to an ion conduction layer. Besides copper, metals such as Al, Ti or tin (Sn) may be contained as impurities. The material that forms the second electrode 103 is preferably Ru or platinum (Pt).

The ion conduction layer of the semiconductor device of the present exemplary embodiment will now be described. In the present exemplary embodiment, the porous film 102 performs the role as the ion conduction layer. Preferably, the ion conduction layer contains at least Si, O and C as principal components. In case the ion conduction layer has a cyclic siloxane structure including Si and O, conduction of ions through the film is facilitated. Also preferably, the ion conduction layer is a film composed of elements Si, O and C. One of the reasons therefor is that, if an insulation layer that becomes the ion conduction layer contains C, the value of the dielectric constant in the ion conduction layer may be made smaller. Since this renders the voltage-dependent graph for forming metal crosslinks steeper, it becomes possible to improve the disturb characteristic in the operating voltage range.

On the other hand, the dielectric constant of the ion conduction layer is not less than 2.5 and not more than 3.5. In general, if, in an insulation layer having SiOC as skeleton, the dielectric constant of the insulation film becomes larger than 3.5, the film density becomes higher, which is not desirable for use as the ion conduction layer. On the other hand, if it is attempted to maintain the dielectric constant of the insulation film at 2.5 or less, water absorption increases, thus leading to increased leakage current.

Preferably, the C/Si ratio in the porous film is in a range from 0.4 to 3.5, while the O/Si ratio in the porous film is 0.5 to 1.5.

The ion conduction layer in the present exemplary embodiment is a dual-layer structure formed by a first ion conduction layer 102a and a second ion conduction layer 102b. The first ion conduction layer 102a features an intra-film carbon concentration which is higher than that of the second ion conduction layer 102b.

Here, the dual-layer structure is shown as a preferred exemplary embodiment. However, if the carbon concentration in a portion of the ion conduction layer in contact with copper is higher than that in other portions, the ion conduction layer may be of three or more layers. Also, the carbon concentration may be varied stepwise or continuously.

The semiconductor device of the present exemplary embodiment is a variable resistance element exploiting an electrochemical reaction and metal ion mobility in the ion conductor. The first electrode performs the role of supplying copper ions to the ion conduction layer. The on/off control is exercised by applying the voltage to the variable resistance element or causing the current to flow in the variable resistance element. In more concrete terms, the variable resistance element exploits electrodiffusion of copper from the first electrode into the ion conduction layer to exercise on/off control.

Next, the method for forming an SiOC film, used as an ion conduction layer, will be described. The method for forming the SiOC film includes a step of forming the SiOC film on a first electrode using a vapor of an organic silica compound, having at least silicon and oxygen as skeleton, and diluted by an inert gas.

Preferably, the organic silica compound is a cyclic organic silica compound having silicon and oxygen as skeleton and including at least one unsaturated hydrocarbon group linked to its side chain.

In more concrete terms, the organic silica compound is preferably of a structure shown by the following chemical formula 1 or 2, where each of R1 and R2 preferably represents hydrogen, a methyl group, an ethyl group, a propyl group, an isopropyl group or a vinyl group.

[Chemical formula 1]

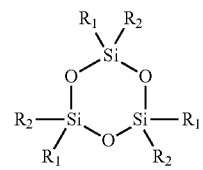

chemical formula 1

[Chemical formula 2]

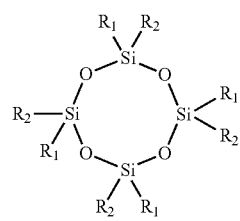

chemical formula 2

The organic silica compound may, for example, be such an organic silica compound in which R1 and R2 in the chemical formula 1 are a methyl group and a vinyl group, respectively, as shown by the following chemical formula 3:

[Chemical formula 3]

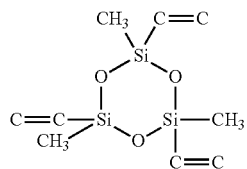

chemical formula 3

The chemical formula 4 shows the structure of the organic silica compound of the chemical formula 1 in which R1 and R2 are an ethyl group and a vinyl group, respectively.

[Chemical Formula 4]

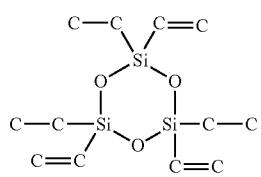

chemical formula 4

The chemical formula 5 shows the structure of the organic silica compound of the chemical formula 1 in which R1 and R2 are an isopropyl group and a vinyl group, respectively.

[Chemical formula 5]

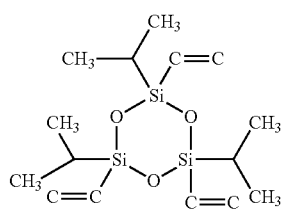

chemical formula 5

The chemical formula 6 shows the structure of an organic silica compound of the chemical formula 1 in which R1 and R2 are a methyl group and hydrogen, respectively.

[Chemical Formula 6]

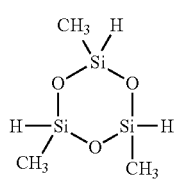

chemical formula 6

The chemical formula 7 shows the structure of the organic silica compound of the chemical formula 1 in which R1 and R2 are a methyl group and an isopropyl group, respectively.

[Chemical Formula 7]

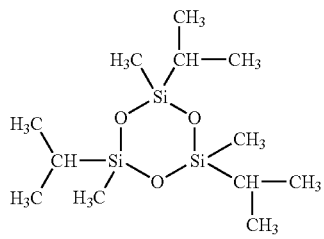

chemical formula 7

The chemical formula 8 shows the structure of the organic silica compound of the chemical formula 2 in which R1 and R2 are a methyl group and a vinyl group, respectively.

[Chemical formula 8]

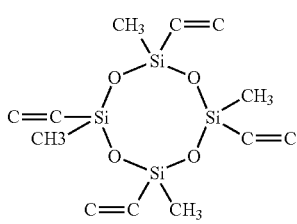

chemical formula 8

The chemical formula 9 shows the structure of the organic silica compound of the chemical formula 2 in which R1 and R2 are a methyl group and hydrogen, respectively.

[Chemical formula 9]

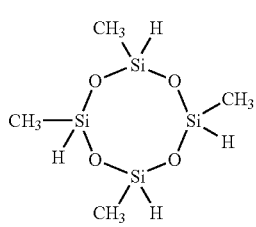

chemical formula 9

The chemical formula 10 shows the structure of an organic silica compound of the chemical formula 2 in which R1 and R2 are a vinyl group and hydrogen, respectively.

[Chemical formula 10]

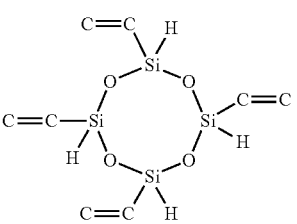

chemical formula 10

The chemical formula 1 is a six-membered ring because the numbers of Si and O total at six. The chemical formulas 3 through to 7 are also six-membered rings. On the other hand, the chemical formula 2 is an eight-membered ring because the numbers of Si and O total at eight. The chemical formulas 8 through to 10 are also eight-membered rings. No matter which of the chemical formulas 1 to 10 is used as a starting feedstock material, the O/Si ratio of the insulation film formed is ca. 1 (unity), thus ranging from 0.5 to 1.5.

In the present exemplary embodiment, no concrete Example is shown for organic silica compounds of the chemical formula 1 or 2 where R1 or R2 is a propyl group. However, from the results of experiments for the cases where the chemical formulas 1 through to 9 are used as starting feedstock materials, it may be predicted that the compounds for the cases where R1 or R2 is a propyl group may also be used as starting feedstock materials in preparing the porous film of the present exemplary embodiment.

The method to form the porous film of the present exemplary embodiment will now be explained in detail. Here, the case of forming the porous film using an organic siloxane starting feedstock material and an inert carrier gas will be explained.

(Device)

Figure 2:
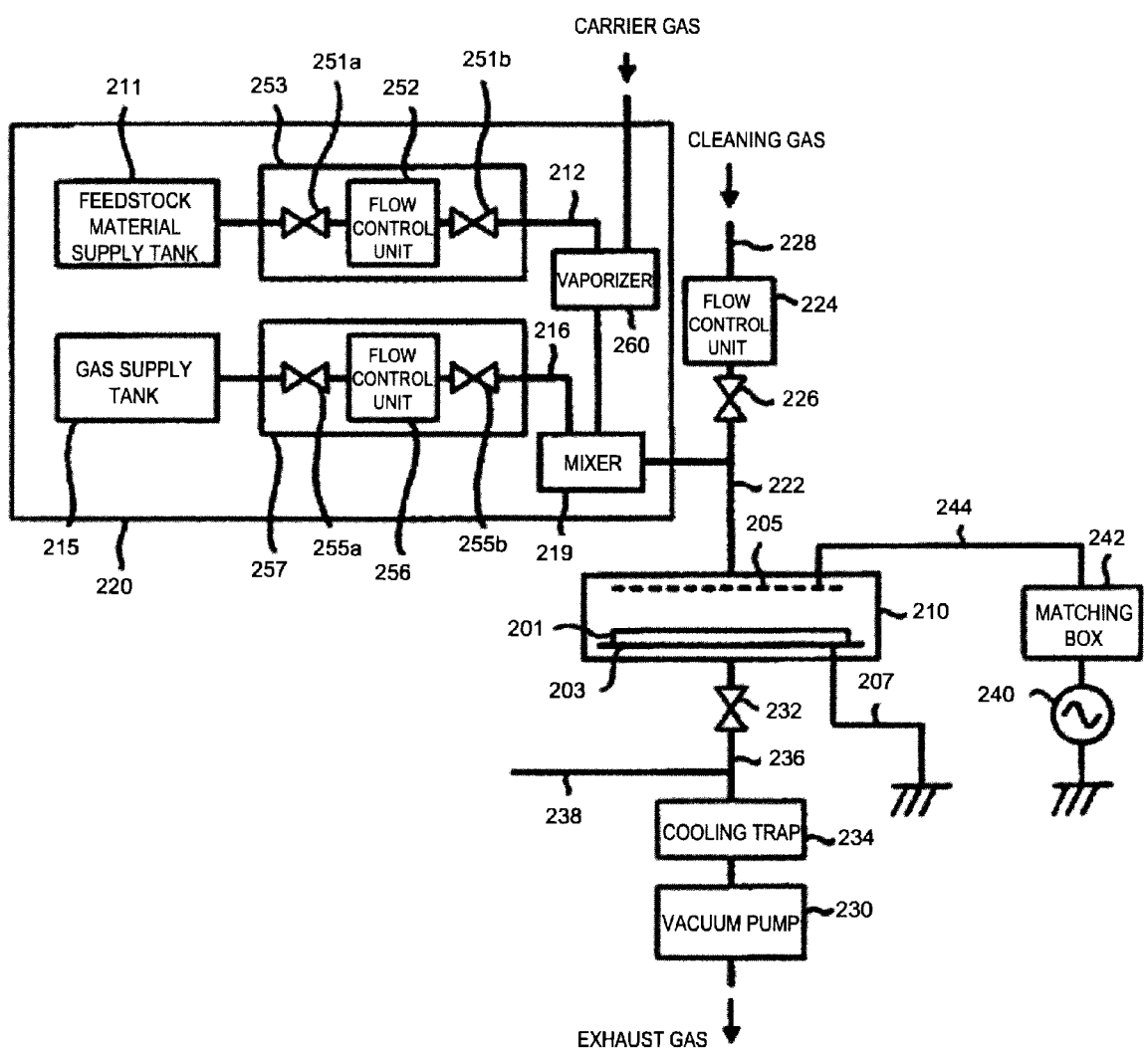
FIG. 2 is a block diagram showing an example configuration of a device for manufacturing an ion conduction layer of the variable resistance element according to the present disclosure.

FIG. 2 depicts a block diagram showing an example configuration of a plasma CVD apparatus used in forming a porous film based on the method of the exemplary embodiment.

Referring to FIG. 2, the plasma CVD apparatus includes a reaction chamber 210, a gas supply section 220, a vacuum pump 230 and a high frequency (Radio Frequency or RF) power supply 240. The gas supply section 220 communicates with the reaction chamber 210 via a gas supply conduit 222. A vacuum pump 230 is connected to the reaction chamber 210 via a gas discharge conduit 236. The gas discharge conduit 236 is provided with a valve 232 and a cooling trap 234. The high frequency power supply 240 is connected via a high frequency cable 244 to the reaction chamber 210. A matching box 242 is provided on the high frequency cable 244.

A substrate heater 203 and a shower head 205 are provided facing each other within the reaction chamber 210. A grounding line 207 is connected to the substrate heater 203, which substrate heater 203 is provided with a heater, not shown. The substrate heater 203 holds a material 201 being formed thereon a film, such as a semiconductor substrate, to heat the material 201. The gas supply conduit 222 is connected to the shower head 205 to operate as a gas ejection part that ejects a gas supplied via the gas supply conduit 222 to the material 201. The shower head 205 is connected to the high frequency cable 244.

A starting feedstock gas, for example, is supplied to the shower head 205 from the gas supply section 220 via the gas supply conduit 222. At the same time, the high frequency power, produced by the high frequency power supply 240, has its frequency changed into a pre-set frequency by the matching box 242 arranged halfway on the high frequency cable 244, and is supplied in this state to the shower head 205. This sets the gas in a space between the substrate heater 203 and the shower head 205 into a state of plasma.

The gas supply section 220 is provided with a number of feedstock material supply tanks corresponding to the number of the sorts of the cyclic organic siloxane starting feedstock gases in use, and with a supply tank for supplying a gas for addition. This supply tank for supplying the gas for addition is referred to below simply as a 'gas supply tank'. The gas supply section 220 also includes a mixer 219 that mixes the gases supplied from the respective tanks. FIG. 2 shows a case where the gas supply section 220 is provided with a feedstock material supply tank 211, charged with a sole cyclic organic siloxane compound, and a gas supply tank 215 for supplying the gas for addition. The gas for addition may be dispensed with, if so desired.

One end of the gas supply conduit 222 is connected to the mixer 219. The feedstock material supply tank 211 is connected via a conduit 212 to the mixer 219, while the gas supply tank 215 is connected via a conduit 216 to the mixer 219.

A flow controller 253 and a vaporizer 260 are provided on the conduit 212 between the feedstock material supply tank 211 and the mixer 219. The flow controller 253 includes two valves 251a, 251b and a flow control unit 252 provided between these valves. An inert gas is supplied as carrier gas to the vaporizer 260. Here, a helium (He) gas is supplied as the inert gas to the vaporizer 260, which vaporizer 260 vaporizes a liquid starting feedstock material supplied from the feedstock material supply tank 211 to deliver the starting feedstock gas along with the carrier gas to the mixer 219.

The conduit 216 includes a flow controller 257 between the gas supply tank 215 and the mixer 219. The flow controller 257 includes two valves 255a, 255b and a flow control unit 256 provided between these valves.

Referring to FIG. 2, a cleaning gas supply conduit 228 is connected halfway on the gas supply conduit 222. A flow control unit 224 and a valve 226 are provided on the cleaning gas supply conduit 228. A waste liquid conduit 238 is branched from between the valve 232 and the cooling trap 234 on the gas discharge conduit 236.

To prevent the gases from being liquefied in transit, heaters, not shown, are preferably arranged around the conduits 212, 216 and around the gas supply conduit 222, thereby heating the conduits 212, 216 and the gas supply conduit 222. For the analogous reason, to prevent gas molecules supplied to the reaction chamber 210 from being liquefied before excitation, preferably another heater, also not shown, may be provided around the reaction chamber 210 for heating the chamber.

(Forming A Porous Film)

Next, a sequence of operations to form a porous film (ion conduction layer), with the use of the above described plasma CVD device 50, will now be described.

After placing the material 201 on the substrate heater 203, the vacuum pump 230 is set into operation, and the valve 232 is opened to reduce the pressure in the reaction chamber 210 to set an initial vacuum in the chamber 210 at several Torrs. The moisture in the gas discharged from the reaction chamber 210 is removed by the cooling trap 234. The substrate heater 203 heats the material 201 so that the surface temperature on the material 201 will be in a pre-set temperature range. Meanwhile, 1 Torr is approximately equal to 133 Pa. In the following, the Torr unit is sometimes used as a pressure unit.

Then, a gas mixture of a starting feedstock gas, here an organic siloxane gas, a carrier gas and a gas for addition, is supplied from the mixer 219 and the gas supply conduit 222 into the reaction chamber 210. At the same time, the high frequency power supply 240 and the matching box 242 are set into operation to supply the high frequency power at the pre-set frequency into the reaction chamber 210.

In supplying the starting feedstock gas material into the reaction chamber 210, the flow controller 253 controls the flow of the organic siloxane gas, while the flow controller 257 controls the flow of the carrier gas. Thus, a gas mixture of a pre-set composition is generated in the mixer 219 and is supplied to the reaction chamber 210. Preferably, a partial pressure of the gas mixture in the reaction chamber 210 is maintained in a range of ca. 0.1 to 3 Torrs. Also preferably, the operation of the vacuum pump 230 is controlled to maintain the pressure of an atmosphere in the reaction chamber 210 during the time of forming the porous film in an approximate range of 1 to 6 Torrs. Also preferably, to manufacture an insulation film of low dielectric constant, the partial pressure of the starting feedstock gas is set at most at 0.3 Torr or less.

Preferably, the surface temperature of the material 201 is maintained in a range of 100 to 400° C. by heating by the substrate heater 203. The range of the temperature is more preferably in a range of 200 to 350° C.

Under these processing conditions, molecules of the organic siloxane starting feedstock material, as the gas of the starting feedstock material, are excited by the plasma, and molecules in the activated state get to the surface of the material 201 where a porous film is generated. If groups having unsaturated bonds are contained in the molecules of the starting feedstock gas, the molecules excited by the plasma and activated get to the surface of the material 201 where the molecules receive further thermal energies from the substrate heater 203. This causes a ring-opening reaction of the unsaturated bonds in the groups to cause a thermal polymerization reaction to proceed among the molecules to form the porous film.

In forming a silicon oxide film as an insulation film, an oxidizing gas is ordinarily used. In the present exemplary embodiment, a metal that may readily be oxidized, such as copper, is used as a material of the first electrode 101 shown in FIG. 1. However, in forming the porous film as the insulation film, the oxidizing gas may not be used in the gas for addition or in the carrier gas, thereby preventing the metal from being oxidized.

In FIG. 2, a single feedstock material supply tank 211 is used. It is however also possible to use a plurality of feedstock supply tanks and to use a plurality of sorts of feedstock gases to form the porous film. In forming the porous film using a plurality of sorts of the starting feedstock gases, it is possible to change the ratio of flow rates of the starting feedstock gas of the six-membered siloxane structure and the starting feedstock gas of the eight-membered siloxane structure to adjust the value of the ion conductivity of the porous film to a desired value. Not only two but three or more of the sorts of the feedstock gases in use may be used.

The contents of operating commands for the substrate heater 203, vacuum pump 230, flow controllers 253, 257, high frequency power supply 240, matching box 242 and the valves 226, 236 in accordance with the sequence of operations in forming the porous film may be stated in a program. A micro-computer may then perform the processing in accordance with the program to control the plasma CVD device to prepare the porous film.

(Adjustment of Carbon Concentration)

The method to decrease the concentration of carbon contained in the ion conduction layer continuously (gradually) or stepwise in forming the ion conduction layer on the copper electrode will now be described.

A starting feedstock material of a structure shown by the chemical formula (4) was used as cyclic organic siloxane, while He was used as the inert carrier gas. The substrate temperature was set at 350° C., the flow rate of He was set at 1000 sccm (standard cm$^3$/min) and the flow rate of the starting feedstock material was set at 65 sccm. The present inventors have found that the intra-film carbon concentration decreases depending on the amount of the RF power. That is, the larger the RF power, the higher is the rate of decomposition of the starting feedstock material in the plasma. By varying the amount of the RF power, based on this phenomenon, it becomes possible to control the carbon concentration in the ion conduction layer obtained.

Figure 3A:
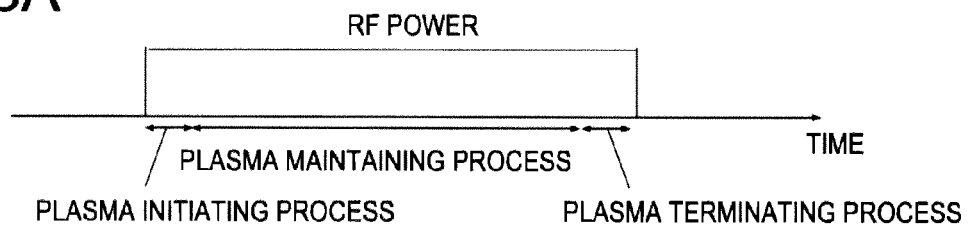
FIG. 3A is a schematic view for illustrating a conventional example pattern of applying a high frequency (RF) power.

FIGS. 3A to 3E show an example RF power change pattern in the film-forming process. FIG. 3A shows a routine manner of applying the RF power which is constant from the beginning to the end. FIGS. 3B to 3E show the manner of applying the RF power according to the present disclosure.

When the pressure in the reaction chamber is stabilized at a desired value, an RF power is applied to a shower head to excite the plasma. This process is termed a 'plasma excitation process' or a 'plasma generating (initiating) process'.

The RF power, applied to the shower head, is changed to a high voltage side and the plasma is maintained depending on the desired film thickness of the insulation film. This process is termed a 'plasma maintaining process'. At this time, the RF power applied to the shower head is preferably larger than that in the process of plasma excitation. By increasing the RF power, it is possible to promote destruction of the structure of the starting feedstock material to decrease the carbon concentration.

The application of the RF power is then stopped (the process towards stopping the plasma is termed a 'plasma terminating process'). At this time, the RF power applied is preferably greater than the RF power during the plasma maintaining process. The carbon concentration may be decreased further by increasing the RF power.

Figure 3B:
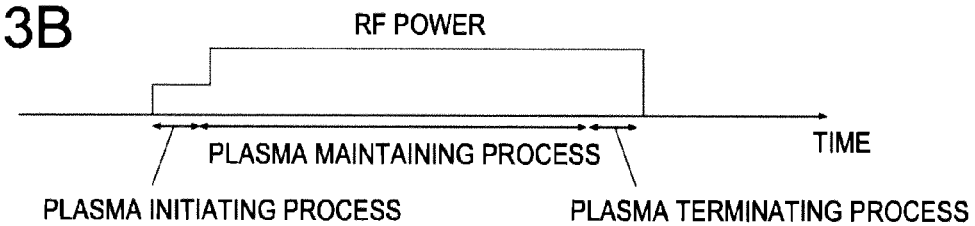
FIGS. 3B to 3E are schematic views for illustrating several inventive example patterns of applying a high frequency power, in forming an ion conduction layer of the variable resistance element according to the present disclosure.
Figure 3C:
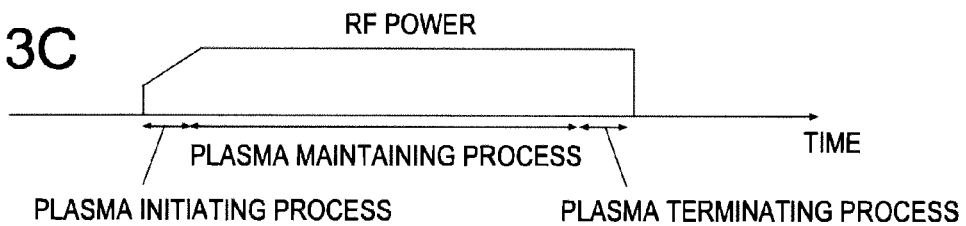
Figure 3D:
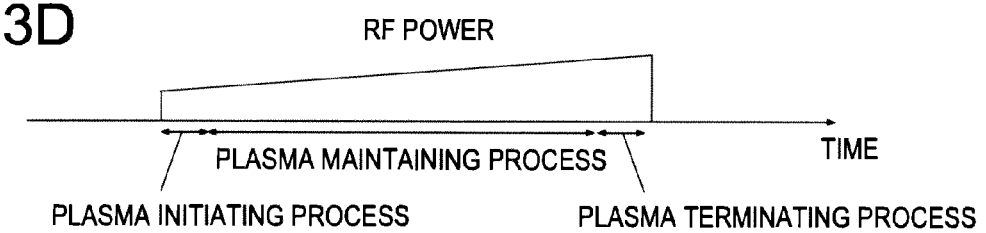
Figure 3E:
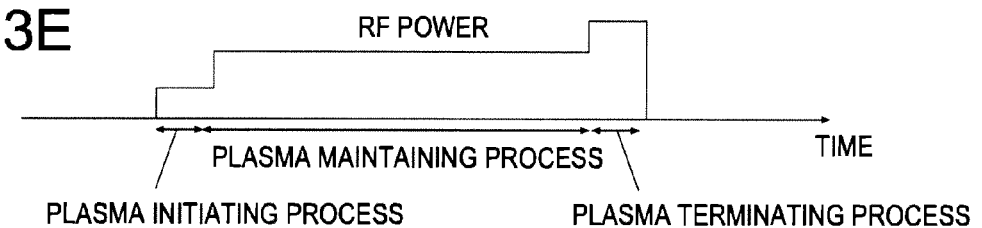

Several example RF power applying patterns according to the present disclosure are shown in FIGS. 3B to 3E. In FIG. 3B, for example, the power value is low during the plasma generating step, while being high during the plasma maintaining process-plasma terminating process. In FIG. 3C, the power is continuously increased from a low value during the plasma generating process and maintained at a high value until the plasma terminating process. In FIG. 3D, the power is increased continuously from a low value since the plasma generating process until the plasma terminating process. In FIG. 3E, the power is at a low value during the plasma generating process, at a high value during the plasma maintaining process and at a still higher value during the plasma terminating process.

Another method to decrease carbon on the surface of the ion conduction layer in forming the ion conduction layer will now be described.

An ion conduction layer free of changes in carbon concentration is formed by, for example, the above mentioned method. (That is, the plasma CVD processing is carried out without changing the RF power value). The inside of the reaction chamber then is evacuated and, in a state where there is left no organic siloxane feedstock material in the reaction chamber, 1000 sccm of He is supplied into the chamber as an inert carrier gas. When the pressure in the reaction chamber is stabilized at a desired value, the RF power is supplied to the shower head to excite the plasma. Due to He ion bombardment by this plasma, carbon in the vicinity of the upper surface of the ion conduction layer is removed so that a region of low carbon concentration is produced (see FIG. 4B).

With the use of the method for forming the ion conduction layer in the present exemplary embodiment, it is possible to provide a variable resistance element having first and second electrodes and an ion conduction layer between the first and second electrodes, containing at least oxygen and carbon, in which the carbon concentration in the ion conduction layer decreases continuously or stepwise from the first electrode side.

The carbon concentration in the ion conduction layer towards the first electrode side, which is a copper electrode in the present exemplary embodiment, is preferably as high as possible. Conversely, the carbon concentration in the ion conduction layer towards the second electrode side is preferably as low as possible. In the present exemplary embodiment, the composition of the ion conduction layer towards the copper electrode side may be Si:O:C=1:1:3.6, while that towards the second electrode side may be Si:O:C=1:1:2.5

In case the carbon concentration in the ion conduction layer decreases continuously or stepwise from the first electrode side, crosslinks by precipitation of copper ions, formed for extending throughout the inside of the ion conduction layer, are severed at a zone of the ion conduction layer towards the first electrode. Hence, copper ions are preferentially recovered from crosslinks in an area of the inside of the ion conduction layer exhibiting the high carbon concentration. This allows the electric field to be applied to the area of the inside of the ion conduction layer exhibiting the low carbon concentration to permit facilitated recovery of copper ions in the inside of the ion conduction layer. Hence, the variable resistance element may be improved in its switching characteristics.

(Exemplary Embodiment 2) Structure of A Variable Resistance Element

Figure 4A:
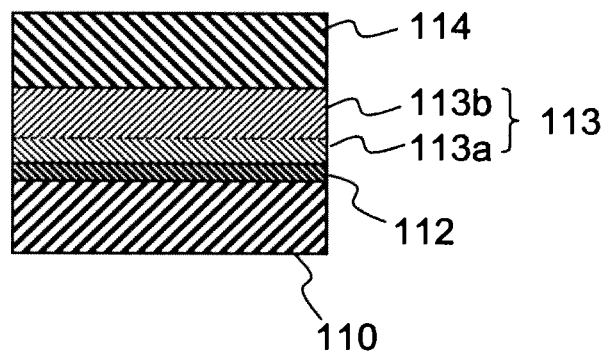
FIG. 4A is a schematic cross-sectional view showing an exemplary embodiment of the variable resistance element according to the present disclosure and FIG. 4B is a schematic cross-sectional view showing another exemplary embodiment of the variable resistance element according to the present disclosure.
Figure 4B:
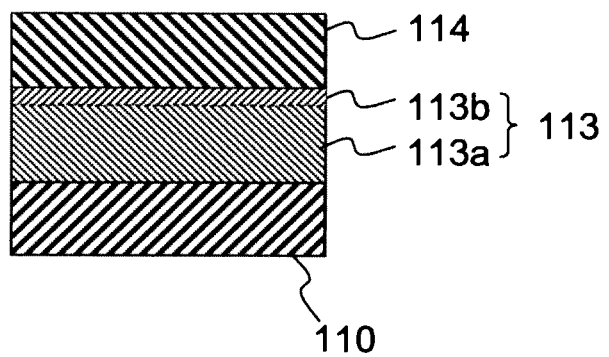

The configuration of the variable resistance element of the present exemplary embodiment will now be described. FIGS. 4A, 4B are cross-sectional views showing an example configuration of a variable resistance element of the present exemplary embodiment.

The variable resistance element, shown in FIG. 4A, includes a first electrode 110, a titanium oxide film 112, an ion conduction layer 113 and a second electrode 114. The titanium oxide film 112, ion conduction layer 113 and the second electrode 114 are formed in this order on the first electrode 110.

FIG. 4B depicts a cross-sectional view showing a structure of a variable resistance element of a further different exemplary embodiment. In this exemplary embodiment, there is formed no titanium oxide layer on the first electrode. In forming the ion conduction layer 113, a first ion conduction layer 113a of a uniform carbon concentration is initially formed. An upper layer part of the first ion conduction layer is processed with plasma in a carbon-free atmosphere to form a region 113b of low carbon concentration. Finally, the second electrode 114 is formed.

The exemplary embodiment of the method for manufacturing the variable resistance element shown in FIG. 4A will now be described in detail with reference to FIGS. 5A-5C. It should be noted that the present disclosure is not limited to the exemplary embodiment as now explained.

Figure 5A:
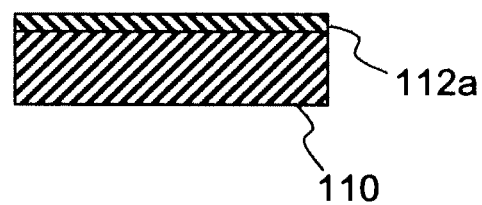
FIGS. 5A to 5C are schematic cross-sectional views for illustrating a manufacturing method for the variable resistance element shown in FIG. 4A.
Figure 5B:
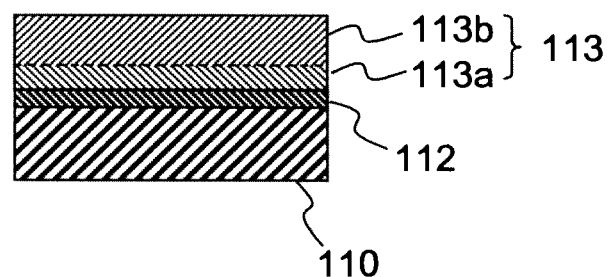
Figure 5C:
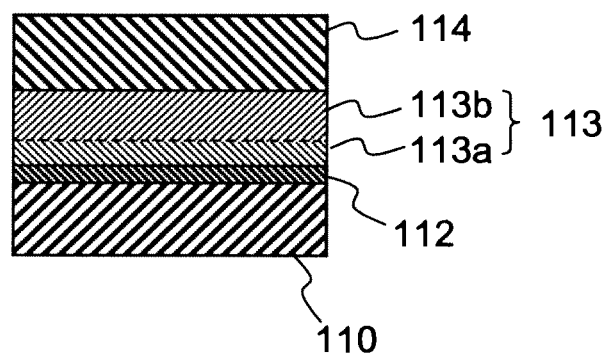

Initially, a titanium film 112a is formed on the first electrode 110 formed of a metal(s), mainly copper (FIG. 5A). Then, there is formed the ion conduction layer 113 on top of the titanium film 112a, at the same time as the titanium film 112a is oxidized to the titanium oxide film 112 (FIG. 5B). The second electrode 114 is then formed on the ion conduction layer 113 (FIG. 5C).

In the variable resistance element, manufactured by the present exemplary embodiment, there is interposed the ion conduction layer 113 between the second electrode 114 which is to be the upper electrode and the first electrode 110 which is to be the lower electrode. The titanium oxide film 112 also is occasionally so interposed. The variable resistance element is also a layered structure composed by the first electrode 110, (occasionally the titanium oxide film 112), the ion conduction layer 113 and the second electrode 114, layered in this order. The first electrode 110 is a copper-containing metallic film, while the ion conduction layer 113 is a porous film mainly composed of Si, C and O.

The ion conduction layer 113 in the present exemplary embodiment is of a dual structure (113a, 113b), as in FIG. 1.

The ion conduction layer 113a is featured by the intra-film carbon concentration which is higher than that in the ion conduction layer 113b. In the present exemplary embodiment, the dual-layer structure is shown as a preferred exemplary embodiment. However, a structure with three or more layers may also be used provided that the carbon concentration of an area of the ion conduction layer in contact with copper (first electrode) is higher than that in the other areas. Such a structure in which the carbon concentration is changed stepwise or continuously may also be used.

To illustrate the method of forming the variable resistance element shown in FIG. 4A in detail, a specified example method will now be described. It is assumed here that a silicon wafer is used as the material being formed thereon a film.

The first electrode 110 is formed of copper and is formed by sputtering or electroplating on a substrate, not shown in the drawings. Impurities such as Al, Sn or Ti may be contained in addition to copper. Then, as shown in FIG. 5A, a titanium film 112a is formed on the first electrode 110 by, for example, a DC (Direct Current) sputtering method. In forming the titanium film 112a on an 8-inch silicon wafer, for example, the rate of growth equal to approximately 22 nm/min may be obtained with the pressure in the reaction chamber of 0.35 Pa, Ar flow rate of 40 sccm, a substrate temperature equal to ambient temperature and a sputtering power of 0.2 kW. The thickness of the titanium film deposited is preferably 2 nm or less.

A process of forming the ion conduction layer 113 on top of the titanium film 112a will now be described. A porous film, composed mainly of Si, C and O, may be formed by, for example, a plasma CVD method employing a vapor of an organic silica starting feedstock material shown in the chemical formula 2 or 3. The following explanation is made for a case of using a plasma CVD device of FIG. 2.

For organic siloxane, a starting feedstock material shown in the chemical formula 1 or 2 may be used. A supply rate of the starting feedstock material is in a range from 10 to 200 sccm. A helium (He) gas is used as an inert carrier gas and is supplied at a supply rate ranging from 300 to 2000 sccm. It is not mandatory to supply He via the vaporizer 260 as the carrier gas, such that part of He may be directly supplied into the reaction chamber 210. It is preferred that the substrate temperature is 350° C., the distance between two electrodes of the shower head 205 and the substrate heater 203 is 10 mm and that the RF power to the shower head 205 ranges between 50 W to 300 W at a frequency of 13.5 MHz.

It should be possible to maintain the pressure in the reaction chamber 210 at 1.0 to 6.0 Torrs. In this state, an organic siloxane starting feedstock material and the carrier gas He are supplied into the reaction chamber 210.

It is preferred that supply of the He gas is commenced at the outset and, when the pressure in the reaction chamber is stabilized, the supply of the cyclic organic siloxane starting feedstock material is commenced. In addition, the target supply volume of the organic siloxane starting feedstock material was set to be reached in ca. 10 sec in order to suppress the closure of the vaporizer due to polymerization of the starting feedstock material with itself in the vaporizer.

In supplying He, it was supplied at a rate of 500 sccm via the vaporizer for the starting feedstock material, while it was directly supplied at a rate of 500 sccm into the reaction chamber 210 via a separate supply line. The flow rate of He, subsequently supplied into the reaction chamber 210, was controlled by controlling the He supply quantity via the separate supply line, so that the flow rate of He to the vaporizer was constant at 500 sccm. By providing for the constant supply rate of He via the vaporizer 260, it was possible to provide for a stabilized temperature in the vaporizer 260 as well as stabilized supply of the starting feedstock material.

Next, when the supply of He and the starting feedstock material is stabilized, and the pressure in the reaction chamber has become constant, the RF power commences to be applied.

In the present exemplary embodiment, the RF power was varied in accordance with the RF power loading technique shown in FIG. 3B. In the process of plasma excitation, the RF power was set at 25 W and applied for 2 seconds. Then, in the plasma maintaining process, the RF power was increased up to 88 W which was maintained for 6 seconds. The power supply was then discontinued. In each step, the wafer was taken out at each process and measurement of the intra-film carbon concentration was made by XPS (X-ray photoelectric spectroscopy. It was found that, while the composition of the ion conduction layer formed during the process of plasma excitation was Si:O:C=1:1:3.6, that formed during the plasma maintaining process was Si:O:C=1:1:2.5. It is thus possible to realize a structure in which the proportion of carbon in the composition of the gas mixture in the ion conduction layer is decreased stepwise from the side close to the first electrode to the side remoter from it.

In case the RF power supply techniques, shown in FIGS. 3C to 3E, are used, the carbon concentration in the ion conduction layer may similarly be changed. It is thus possible to form a structure in which the proportion of carbon in the composition in the ion conduction layer is decreased continuously or stepwise from the side close to the first electrode to the side remoter from it.

After the growth of the ion conduction layer has come to a close, the wafer is kept in a stand-by state in the reaction chamber. In this state, the supply of the organic siloxane starting feedstock material is discontinued, and only a He gas is supplied. The RF power is then supplied to remove carbon on the surface of the porous film by the He plasma by way of conversion into $SiO_2$. Then, purging and evacuation of the reaction chamber 210 are repeatedly carried out, after which the wafer is taken out of the reaction chamber 21.

Before the He plasma processing, the film obtained had a dielectric constant of 2.5, while the film composition in case of using the starting feedstock material of the chemical formula 5 was Si:O:C=1:1:2.4.

The composition of the porous film can be changed by changing the ratio between the quantity of the organic siloxane starting feedstock material and that of He. For example, in case the amount of mixing of He was changed from 300 sccm to 1500 sccm against the quantity of the organic siloxane starting feedstock material of 65 sccm, the C/Si ratio in the porous film was decreased from 3.4 to 2.8. Even in case the C/Si ratio in the porous film of the present exemplary embodiment is 2.8, the porous film operates satisfactorily as the porous film.

On the other hand, a C/Si ratio in the porous film of 2.1 could be obtained in case the organic siloxane starting feedstock material was changed from the compound of the chemical formula 2 to the compound of the chemical formula 3. That is, with the use of the technique of the present disclosure, a gradient in the carbon concentration can be obtained in the ion conduction layer having a desired carbon concentration.

As the porous film, 'AURORA' (registered trademark) may be used. In this case, the C/Si ratio may be set to 0.4 to 2.0 by adjusting the processing condition. If, as in the 'AURORA' (registered trademark), a gas mixture of the vapor of the siloxane feedstock material and an oxidizing gas is used, the first electrode is subjected to vigorous oxidation, so that it becomes particularly necessary to use a 'valve metal'.

The structure of the ion conduction layer 113, shown in FIG. 4B, is obtained by forming a layer 113b having a decreased surface carbon concentration, after forming the ion conduction layer 113 in its entirety. It has been confirmed that, in case the He plasma processing is carried out after forming the ion conduction layer (porous film), the carbon concentration of the film surface 113b is decreased. Specifically, it has been confirmed that the higher the RF power, and the longer the processing time, the lower becomes the carbon concentration on the film surface. It is therefore desirable to change the processing condition from time to time in order to get a desired characteristic of the variable resistance element.

Then, in forming the second electrode 114, a metal film to form the second electrode 114 may be deposited on the ion conduction layer 113, using, for example, a DC sputtering method or a long throw sputtering method, with Ru as target. The operating conditions for forming the second electrode include a DC power of 0.2 kW, an Ar gas flow rate of 40 sccm, a pressure of 0.27 Pa and ambient temperature. To suppress desorption of oxygen from the ion conduction layer 113 during the formation of the second electrode as the upper electrode, it is preferred to deposit a metal film on the ion conduction layer 113 at ambient temperature.

The variable resistance element, thus formed, may serve as a variable resistance non-volatile element and as a switching element that makes use of an electrochemical reaction and copper ion mobility in the ion conductor. The variable resistance element may exercise on/off control when a voltage is applied thereto or a current is allowed to flow therethrough. For example, the variable resistance element may manage the on/off control by taking advantage of electrodiffusion of copper into the titanium oxide film 112 or into the ion conduction layer 113. It is noted that the variable resistance element according to the present disclosure may be used not only as a switching element but also as a memory element that makes use of both the non-volatility and variable resistance characteristic.

The substrate, not shown, or the wafer, also not shown, adapted to carry the variable resistance element, may be a substrate on which the semiconductor element has been formed. For example, it may be a silicon substrate, a single-crystal substrate, an SOI (Silicon on Insulator) substrate, a TFT (Thin Film Transistor) substrate or a substrate for the preparation of a liquid crystal.

With the present exemplary embodiment, the ion conduction layer may be formed as oxidation of copper, as the lower electrode, is suppressed, thus enabling manufacturing a variable resistance element having a high switching characteristic.

Also, in forming a titanium oxide film, metal titanium may be deposited on a copper interconnection and the ion conduction layer may then be formed by a plasma CVD method. By so doing, metal titanium may be oxidized in forming the ion conduction layer, so that both titanium oxide and the ion conduction layer may be formed in a self-aligned fashion.

(Exemplary Embodiment 3) Device Structure

The present exemplary embodiment is a semiconductor device having a multilevel interconnection structure in which the variable resistance element of the present disclosure is formed. The semiconductor device of the present exemplary embodiment will now be described with reference to the drawings.

Figure 6A:
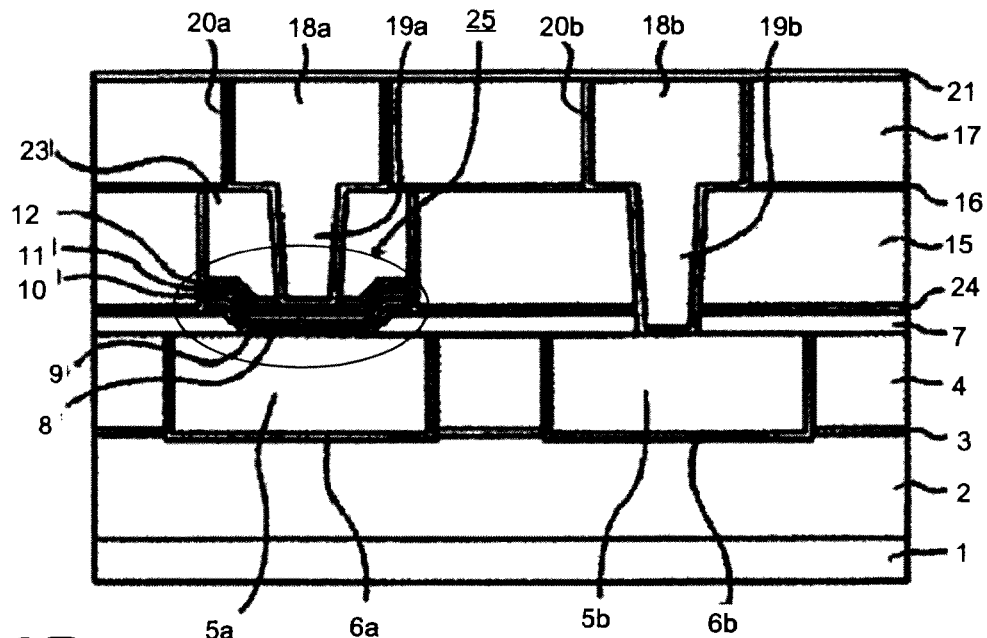
FIG. 6A is a schematic cross-sectional view showing an exemplary embodiment of a device with a built-in variable resistance element according to the present disclosure and FIG. 6B is a schematic cross-sectional view showing another exemplary embodiment of a device with a built-in variable resistance element according to the present disclosure.
Figure 6B:
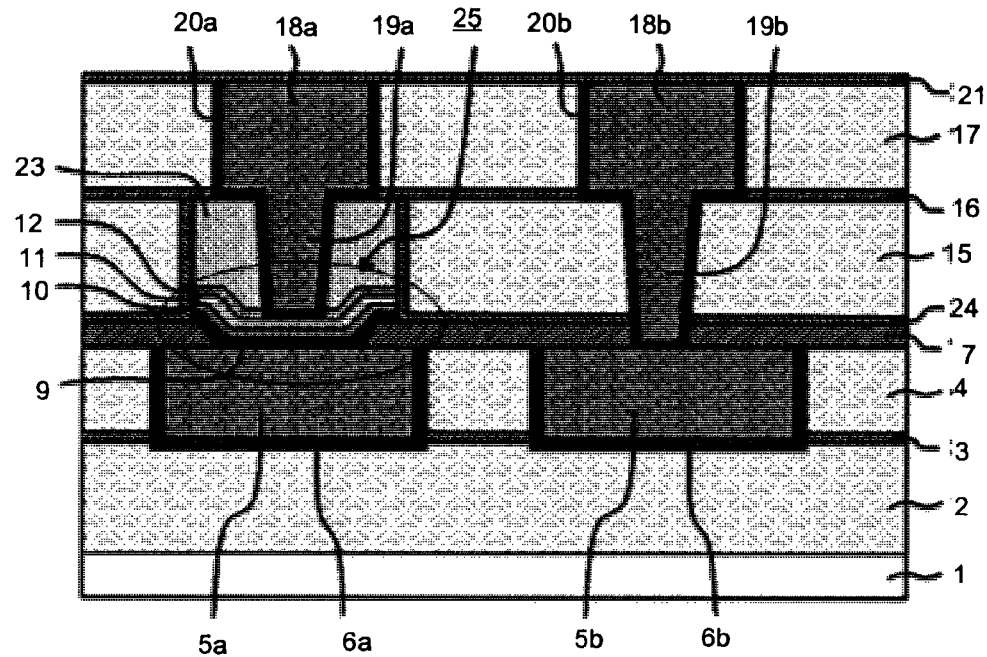
Figure 7A:
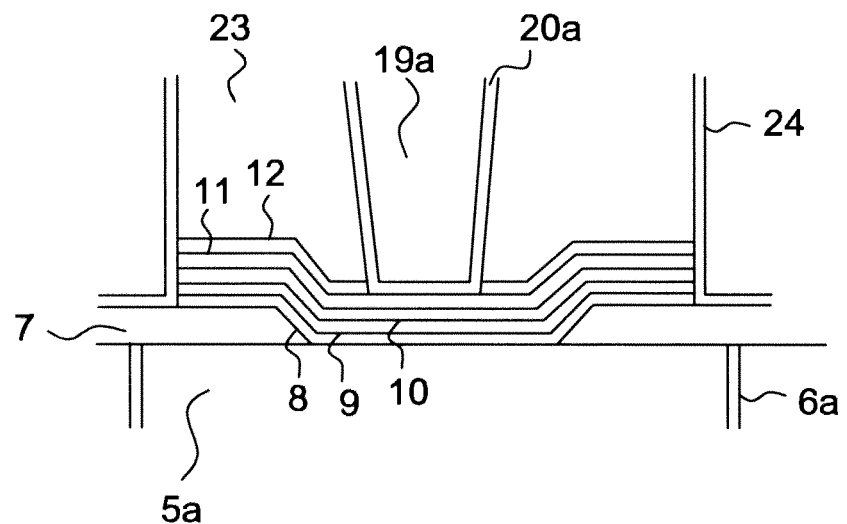
FIG. 7A is an enlarged schematic cross-sectional view showing a variable resistance element part of the device shown in FIG. 6A
Figure 7B:
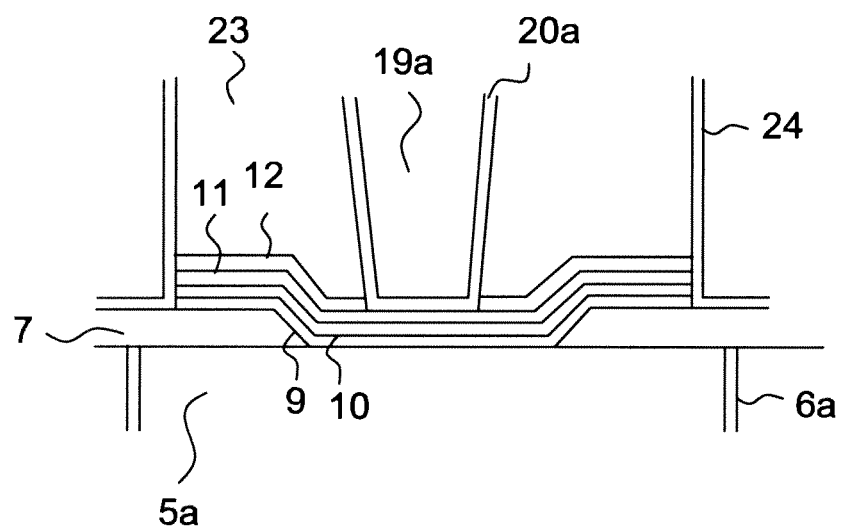
FIG. 7B is an enlarged schematic cross-sectional view showing a variable resistance element part of the device shown in FIG. 6B.

FIGS. 6A and 6B are schematic partial cross-sectional views showing a configuration of the semiconductor device according to the present exemplary embodiment. FIG. 6A shows the semiconductor device including a titanium oxide film 8 and FIG. 6B shows the semiconductor device not including a titanium oxide film 8. FIGS. 7A and 7B respectively depict enlarged cross-sectional views showing the portions of a variable resistance element 25 of FIGS. 6A and 6B (portions surrounded by ellipses in the drawing). The variable resistance element 25 of the semiconductor device in FIG. 6A is composed by a first interconnection 5a, operating as a lower electrode, a titanium oxide film 8, an ion conduction layer (porous film) 9, a first upper electrode 10 and a second upper electrode 11.

In the semiconductor device, shown in FIG. 6A, a thick hard mask film 23 is formed on a stack of a first upper electrode 10, second upper electrode 11 and a hard mask film 12. The lateral sides of the titanium oxide film 8, ion conduction layer 9, first upper electrode 10, second upper electrode 11, hard mask film 12 and the hard mask film 23 are covered by a protective insulation film 24. The protective insulation film 24 is not formed on top of the hard mask film 23 but is formed on top of an insulation barrier film 7. In FIGS. 6A and 6B, interconnections (5b, 18b, 19b), not electrically connected to the variable resistance element 25, are also shown. A plug 19b of a second interconnection 18b is connected via a barrier metal layer 20b to the first interconnection 5b. The configuration of the variable resistance element is analogous with that of the exemplary embodiment 1, and the method for forming it is analogous with that of the exemplary embodiment 2.

The first interconnection 5a is embedded, via a barrier metal layer 6a, in an interconnection groove formed in an interlayer insulation film 4 and in a barrier insulation film 3. The first interconnection 5a, also operating as a lower electrode of the variable resistance element 25, is in direct contact with the titanium oxide film 8. An electrode layer, for example, may be interposed between the first interconnection 5a and the titanium oxide film 8. In case the electrode layer is formed, the electrode layer, the titanium oxide film 8 and the ion conduction layer 9 are preferably formed as one with and in continuation to one another.

The first interconnection 5b is embedded via barrier metal layer 6b in an interconnection groove formed in the interlayer insulation film 4 and in the barrier insulation film 3. The first interconnection 5b is not connected to the variable resistance element 25 and is electrically connected to the plug 19b via the barrier metal layer 20b. The first interconnection 5b is formed of the same material as that of the first interconnection 5a, for example, copper.

The barrier metal layers 6a, 6b are electrically conductive films that shield the lateral and bottom surfaces of the interconnections and are endowed with barrier characteristic to prevent metal contained in the first interconnections 5a, 5b from being diffused to the interlayer insulation film 4 or to lower layer(s). In case the first interconnections 5a, 5b are formed of metal elements, mostly Cu, the barrier metal layers 6a, 6b are formed of high melting point metals or nitrides thereof, such as tantalum (Ta), tantalum nitride (TaN), titanium nitride (TiN) or wolfram carbonitride (WCN), optionally in the form of layered films.

A second interconnection 18a is embedded via barrier metal layer 20a in an interconnection groove formed in an interlayer insulation film 17 and an etching stop film 16. The second interconnection 18a is formed as one with a plug 19a. The plug 19a is embedded via the barrier metal layer 20a in basis hole(s) bored in the hard mask films 23 and 12. The plug 19a is electrically connected to the second upper electrode 11 via the barrier metal layer 20a.

The second interconnection 18b is embedded via barrier metal layer 20b in an interconnection groove formed in the interlayer insulation film 17 and the etching stop film 16. The second interconnection 18b is formed as one with a plug 19b. The plug 19b is embedded via the barrier metal layer 20b in basis holes bored in an interlayer insulation film 15, the protective insulation film 24 and in the insulation barrier film 7. The plug 19b is electrically connected to the first interconnection 5b via the barrier metal layer 20b. The second interconnection 18b and the plug 19b are formed of the same material as that of the second interconnection 18a and the plug 19a, such as Cu.

The barrier metal layers 20a, 20b are electrically conductive films exhibiting a barrier characteristic to prevent metal contained in the second interconnections 18a, 18b, including plugs 19a, 19b, from being diffused to the interlayer insulation films 15, 17 and to lower layers. The barrier metal layers cover up the lateral and bottom surfaces of the second interconnections 18a, 18b and plugs 19a, 19b. In case the second interconnection 18a, 18b and the plugs 19a, 19b are formed of metal elements, mainly Cu, for example, the barrier metal layers 20a, 20b are formed of high melting point metals or nitrides thereof, such as Ta, TaN or WCN, optionally in the form of layered films.

The barrier metal layers 20a, 20b are preferably of the same material as that of the second upper electrode 11. For example, if the barrier metal layers 20a, 20b are of a layered structure of TaN (lower layer)/Ta (upper layer), it is preferred to use TaN, as the lower layer material, for the second upper electrode 11. Or, if the barrier metal layers 20a, 20b are a Ti (lower layer)/Ru (upper layer), Ti as the lower layer material is preferably used for the second upper electrode 11.

The hard mask film 23 is a film that becomes the hard mask at the time of etching the hard mask film 12. The hard mask film 23 is preferably a film differing in film sort from the hard mask film 12. For example, if the hard mask film 12 is a SiN film, a $SiO_2$ film may be used for the hard mask film 23.

The protective insulation film 24 is an insulation film not doing damages to the variable resistance element 25 and having a function of preventing oxygen from being desorbed from the ion conduction layer. For the protective insulation film 24, a SiN film or a SiCN film, for example, may be used. Preferably, the protective insulation film 24 is formed of the same material as that of the hard mask film 12 and the insulation barrier film 7. If the protective insulation film 24 is formed of the same material as that of the hard mask film and the interlayer insulation film, the protective insulation film 24 may become, as it were, one with the hard mask film 12 and with the insulation barrier film 7, thus improving tight bonding performance at the boundary surfaces.

(Exemplary Embodiment 4) Device Forming Method

The present exemplary embodiment represents an example method of manufacturing the semiconductor device explained in connection with the exemplary embodiment 3. Here, the method for manufacturing the semiconductor device shown in FIG. 6B is mainly explained with reference to the drawings. FIGS. 8 to 11 depict schematic cross-sectional views showing the method for manufacturing the semiconductor device shown in FIG. 6B.

Initially, an interlayer insulation film 2, a barrier insulation film 3 and an interlayer insulation film 4 are sequentially formed on a semiconductor substrate 1. The semiconductor substrate 1 may be a semiconductor substrate itself or a substrate on which a plurality of semiconductor devices, not shown, are already formed. For example, the insulation film 2 is a silicon oxide film with a film thickness of 300 nm, the barrier insulation film 3 is a SiN film with a film thickness of 50 nm and the interlayer insulation film 4 is a silicon oxide film with a film thickness of 300 nm.

Then, interconnection grooves are formed in the interlayer insulation film 4, barrier insulation film 3 and in the interlayer insulation film 2, using a lithographic method. The lithographic method used includes a processing in which a photoresist of a pre-set pattern is formed on the interlayer insulation film 4, and a processing for dry etching in which the layered films are anisotropically etched using a resist as a mask. The lithographic method used also includes a processing in which the resist is removed after forming the interconnection grooves by etching.

The first interconnections 5a, 5b are then formed by embedding metal in the interconnection grooves via the barrier metal layers 6a, 6b. The layered structure of the barrier metals 6a, 6b may, for example, be TaN (film thickness of 5 nm)/Ta (film thickness of 5 nm). The first interconnections 5a, 5b are formed of, for example, copper. An insulation barrier film 7 then is formed on the interlayer insulation film 4 inclusive of the first interconnections 5a, 5b. The insulation barrier film 7 may, for example, be a SiN film with a film thickness of 50 nm.

A hard mask film, not shown, is then formed on the insulation barrier film 7. The hard mask film may, for example, be a silicon oxide film. A photoresist, not shown, having a pre-set opening pattern, is then formed on the hard mask film. The opening pattern is transferred to the hard mask film by dry etching using the photoresist as a mask. The photoresist is then stripped by, for example, oxygen plasma ashing.

Figure 8A:
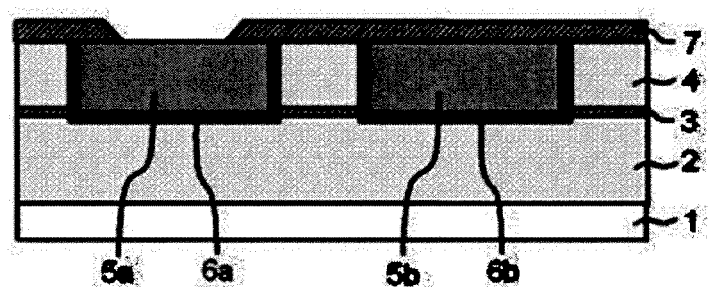
FIGS. 8A to 8C are schematic cross-sectional views for illustrating a manufacturing method for the device shown in FIG. 6B.

The insulation barrier film 7, exposed on the opening of the hard mask film, is then etched back, using the hard mask film as the mask. Here, reactive dry etching is used. The opening getting to the upper surface of the first interconnection 5a is formed in the insulation barrier film 7. Copper oxide formed on the exposed surface of the first interconnection 5a is then removed by organic stripping processing using e.g., an amine-based stripping solution. An etching by-product, generated at the time of the etchback, is also removed at this time. FIG. 8A shows this operating state. The process up to forming the structure shown in FIG. 8A is termed a step B1.

The depth of the interconnection groove, formed in the interlayer insulation film 4 and in the barrier insulation film 3 in the step B1, corresponds to a film thickness of the interlayer insulation film 4 plus an over-etched depth of the order of 70 nm beyond the lower surface of the interlayer insulation film 4. Viz., the interconnection groove traverses the barrier insulation film 3, with the etching further extending a depth of the order of 20 nm from the upper surface of the interlayer insulation film 2. By pre-etching the barrier insulation film 3, in this manner, it is possible to improve etch-through performance of the interconnection groove.

A reactive dry etching, carried out in the step B1 to form the opening in the insulation barrier film 7, may be carried out under the conditions of the $CF_4$/Ar gas flow rate=25:50 sccm, pressure of 0.53 Pa, source power of 400 W and a substrate bias power of 90 W. By lowering the source power or increasing the substrate bias, it is possible to improve ionic properties or to reduce the taper angle at the time of etching. At this time, etching equivalent to 55 nm may be carried out against ca. 30 nm of the residual film of the insulation barrier film 7 at the bottom of the opening of the insulation barrier film 7, corresponding to over-etching of ca. 80%.

In the step B1, the substrate may be heated to 350° C. in a reduced pressure atmosphere. If etchback is carried out in a sputtering device, the heating of the substrate may be carried out in a heat chamber provided in a sputtering device.

If, in the step B1, etchback is performed by RF etching that makes use of a non-reactive gas, the RF etching that makes use of a non-reactive gas may be performed in an RF etching chamber, using an Ar gas, under conditions of an Ar gas flow rate of 30 sccm, a pressure of 1.3 Pa, a source power of 290 W and a substrate bias power of 130 W. The RF etching time may be quantified by the amount of etching of the $SiO_2$ film formed by the plasma CVD method, and may be 3 nm calculated as the film thickness of the $SiO_2$ film.

It is noted that, in the stage of carrying out the step B1, the first interconnection 5b remains shielded by the insulation barrier film 7. The interconnections other than the opening part thus may not be exposed to RF etching.

Figure 8B:
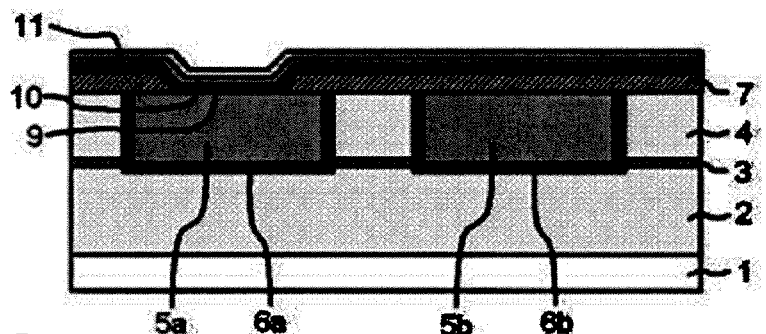

The porous film (ion conduction layer) 9 is then deposited by the RF plasma method. Note that the porous film has been formed using the chemical formula 2 as the starting feedstock material and has a film thickness of 7 nm, for example. The first upper electrode 10 and the second upper electrode 11 are then formed in this order on the porous film 9. FIG. 8B depicts a cross-sectional view at this time point. The first upper electrode 10 is a Ru film with a film thickness of, for example, 10 nm, while the second upper electrode 11 is a Ta film with a film thickness of, for example, 50 nm. The process to form the structure shown in FIG. 8B, beginning from the structure shown in FIG. 8A is termed a step B2.

In case of manufacturing the variable resistance element 25, having the structure shown in FIG. 6A, a film of metal Ti, with a film thickness of 2 nm, is deposited by DC sputtering on the first interconnection 5a exposed and on the insulation barrier film 7 at the beginning state of the step B2. On the metal Ti film, the porous film (ion conduction layer) 9 is deposited by the plasma method. At this time, the metal Ti film is wholly oxidized by oxygen plasma generated by decomposition of the starting feedstock material in the course of forming the porous film 9, thus forming the titanium oxide film 8.

In the plasma CVD method for the porous film, the film may be deposited in the step B2 under the condition of an RF power of 20 to 300 W, the temperature being 350° C., the gas being a gas mixture with He and the pressure being 1.0 to 6.0 Torrs.

Specifically, the film may be formed in an 8-inch plasma CVD reactor under the condition of a He gas flow rate=1500 sccm, a pressure of 3.5 Torrs and an RF power of 100 W. In manufacturing the structure of FIG. 6A, the film thickness of the titanium oxide film against that of metal titanium under this condition was confirmed by observing the cross-section with a TEM (Transmission Electron Microscope). It was confirmed that, in case of deposition of Ti with a film thickness of 2 nm, titanium oxide was formed to a film thickness of 3.0 nm.

If the device specification is such that the power of oxidation by oxygen plasma is strong, it is possible to avoid oxidation of the first electrode by increasing the Ti film thickness.

It is however not mandatory to form the Ti film on the insulation barrier film 7. Viz., the RF power may be lowered or the flow rate of the starting feedstock material increased. By so doing, it is possible to suppress decomposition of the starting feedstock material, generation of the oxygen plasma and oxidation of copper.

For He plasma processing, next following the forming of the porous film, the He gas flow rate may be 1500 sccm, the pressure may be 2.7 Torr and the RF power may be 200 W, with the processing time being 30 seconds, for example. It has been confirmed by XPS (X-ray Photoelectron Spectroscopy) that, by this processing, the C/Si ratio on the upper most surface of the porous film can be decreased from 2.61 to 2.58.

Also, in the step B2, the first upper electrode 10 can be deposited by sputtering, under the condition of a DC power of 0.2 kW, an Ar gas and the pressure of 0.27 Pa, using Ru as target. The second upper electrode 11 can be also deposited by the DC sputtering under the same condition, using Ta as target. The two upper electrodes 10, 11 are deposited under a reduced pressure, and hence are deposited at ambient temperature to suppress oxygen from being desorbed from the ion conduction layer 9.

It is noted that, when the step B2 has been finished, the first interconnection 5b has been shielded by the insulation barrier film 7, ion conduction layer 9, first upper electrode 10 and the second upper electrode 11.

Figure 8C:
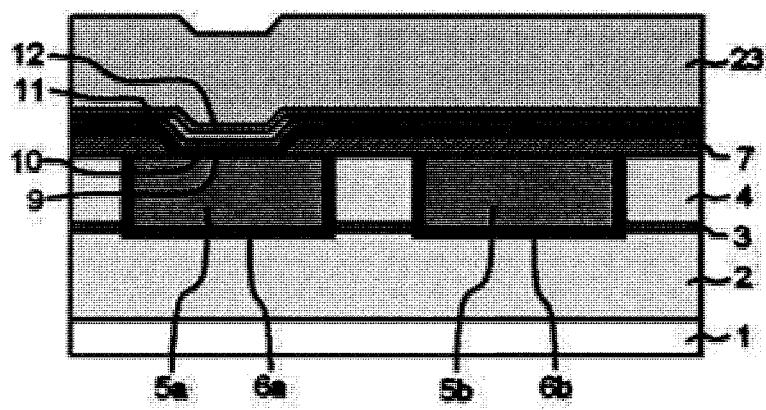

The hard mask film 12 and the hard mask films 23 are then stacked in this order on the second upper electrode 11. FIG. 8C shows the cross-section at this time point. The hard mask film 12 may, for example, be a SiN film with a film thickness of 30 nm, while the hard mask films 23 may, for example, be a $SiO_2$ film with a film thickness of 200 nm. The process to form the structure shown in FIG. 8C, beginning from the structure shown in FIG. 8B, is termed a step B3.

It is noted that the hard mask films 12, 23 may be formed using the plasma CVD method. The hard mask films 12, 23 may be formed using the plasma CVD method customarily used in the relevant technical field. The film growth temperature may be selected in a range of from 200° C. to 400° C. Here, the film growth temperature was set at 200° C.

It is noted that, when the step B3 has been finished, the first interconnection 5b has been shielded by the insulation barrier film 7, ion conduction layer 9, first upper electrode 10, second upper electrode 11 and the hard mask films 12, 23.

Figure 9A:
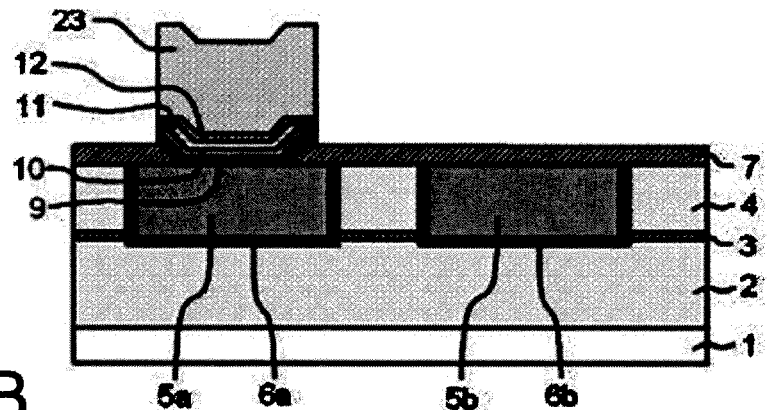
FIGS. 9A to 9C are schematic cross-sectional views, continuing from the previous figures, for illustrating the manufacturing method for the device shown in FIG. 6B.

A photoresist, not shown, for patterning a variable resistance element part, is then formed on the hard mask film 23. Then, using the photoresist as a mask, the hard mask film 23 is dry etched until the hard mask film 12 appears. The photoresist is then removed using oxygen plasma ashing and organic stripping. Then, using the hard mask film 23 as a mask, the hard mask film 12, second upper electrode 11, first upper electrode 10 and the ion conduction layer 9 are dry etched in succession. FIG. 9A shows a cross-section at this time point. The process to form the structure shown in FIG. 9A, beginning from the structure shown in FIG. 8C, is termed a step B4.

It is preferred that, in the step B4, the dry etching of the hard mask film 23 is stopped at the upper surface or in the bulk of the hard mask film 12. In this case, the ion conduction layer 9 is shielded by the hard mask film 12 and hence is not exposed to the oxygen plasma. Also, Ru in the first upper electrode 10 is not exposed to the oxygen plasma. It is thus possible to suppress lateral side etching of the first upper electrode 10. Note that the dry etching of the hard mask film 23 may be by use of a customary parallel flat plate dry etching device.

In the step B4, dry etching of each of the hard mask 12, second upper electrode 11, first upper electrode 10, ion conduction layer 9 and the titanium oxide film 8 may be by use of a customary parallel flat plate dry etcher. The etching of the hard mask film 12, such as SiN film, may be performed under the condition of a $CF_4/Ar$ gas flow rate=25/50 sccm, a pressure of 0.53 pa, a source power of 400 W and a substrate bias power of 90 W.

On the other hand, the etching of the second upper electrode 11, such as Ta, may be performed under the condition of a $Cl_2$ gas flow rate=50 sccm, pressure of 0.53 Pa, source power of 400 W and a substrate bias power of 60 W.

There may be occasions where a flying matter from etched Ta becomes deposited on the sidewall of the hard mask film 12. However, the second interconnection 5a, also used as the lower electrode, is electrically separated via the insulation barrier film 7 from the sidewall of the hard mask film 12. There is thus raised no such problem as shorting across interconnections, such as shorting across the second upper electrode 11 and the second interconnection 5a.

On the other hand, the etching of the first upper electrode 10, such as Ru, may be under the condition of the $Cl_2/O_2$ gas flow rate=5/40 sccm, a pressure of 0.53 Pa, a source power of 900 W and a substrate bias power of 100 W.

The etching of the ion conduction layer 9, a film with a film thickness of 7 nm, obtained using, for example, the chemical formula 5 as the starting feedstock material, may be performed under the condition of a $Cl_2/CF_4/Ar$ gas flow rate=45/15/15 sccm, pressure of 1.3 Pa, source power of 800 W and a substrate bias power of 60 W. In particular, by using a chlorine gas at will, it becomes possible to process the ion conduction layer 9 as the selection ratio relative to SiN of the lower layer is maintained at a higher value to suppress e.g., sub-trenches from being produced. At this time, a residual film thickness of the insulation barrier film 7 on the first interconnections 5a, 5b may be adjusted to be 20 to 40 nm.

Figure 9B:
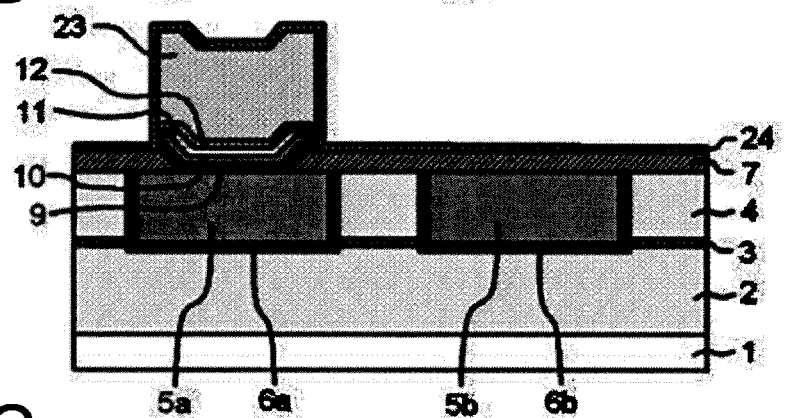

The protective insulation film 24 is then deposited on the hard mask film 23, hard mask film 12, second upper electrode 11, first upper electrode 10, ion conduction layer 9 and on the insulation barrier film 7. FIG. 9B shows a cross-section at this time point. The protective insulation film 24 may, for example, be a SiN film with a film thickness of 30 nm. The process to form the structure shown in FIG. 9B, beginning from the structure shown in FIG. 9A, is termed a step B5.

In the step B5, the protective insulation film 24 may be formed by high density plasma, using $SiH_4$ and $N_2$ as a starting feedstock gas, with the substrate temperature of 200° C. Since no reducing gases, such as $NH_3$ or $H_2$, are used, water-absorbing components in the porous film 9 may be desorbed in the course of the process of stabilizing the film-forming gas directly before film forming. Note that the insulation barrier film 7, protective insulation film 24 and the hard mask film 12 on the first interconnection 5 are formed of the same material, that is, SiN. Since the same material is provided around the variable resistance element for protection, it is possible to improve the tight bonding performance of the boundary surface, water-absorbing performance, water-proofness and resistance against oxygen desorption. Hence, the yield as well as reliability of the variable resistance element may be improved.

Figure 9C:
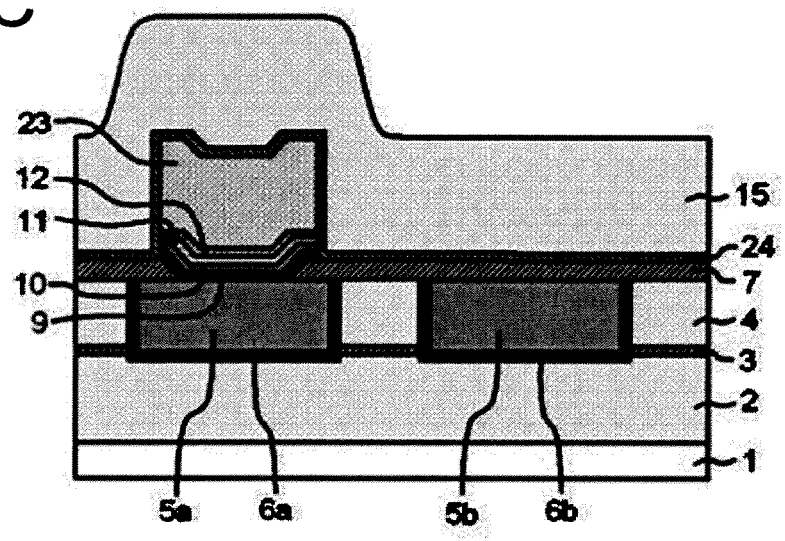

The interlayer insulation film 15 is then deposited on the protective insulation film 24, using the plasma CVD method. FIG. 9C shows the cross-section at this time point. The interlayer insulation film 15 is a silicon oxide film of, for example, a film thickness of 500 nm. The process to form the structure shown in FIG. 9C, beginning from the structure shown in FIG. 9B, is termed a step B6.

Figure 10A:
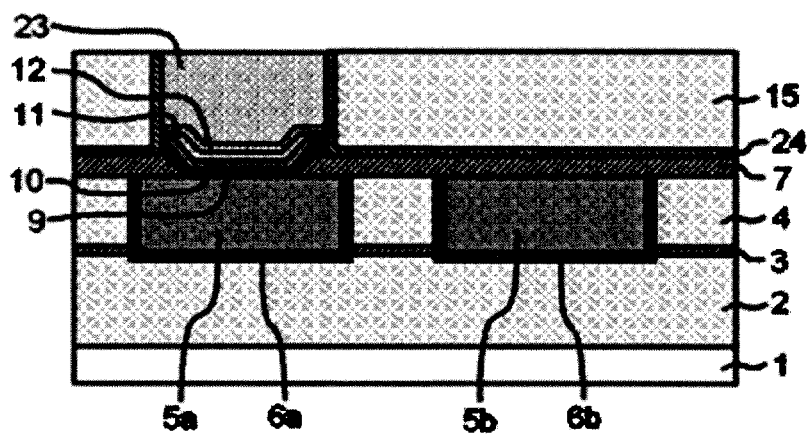
FIGS. 10A and 10B are schematic cross-sectional views, continuing from the previous figures, for illustrating the manufacturing method for the device shown in FIG. 6B.

Then, using CMP, the interlayer insulation film 15 is planarized, as shown in FIG. 10A. The planarizing processing for the interlayer insulation film 15 is termed a step B7.

In planarizing the interlayer insulation film 15, it is possible to scrape off ca. 350 nm from the upper surface of the interlayer insulation film 15 to give a residual film of ca. 150 nm. In the CMP of the interlayer insulation film 15, routine colloidal silica or ceria-based slurry may be used at this time for polishing. Note that, in Example 2, the hard mask film 23 is exposed by planarizing the interlayer insulation film 15, and both the hard mask film 23 and the protective insulation film 24 are also planarized.

Figure 10B:
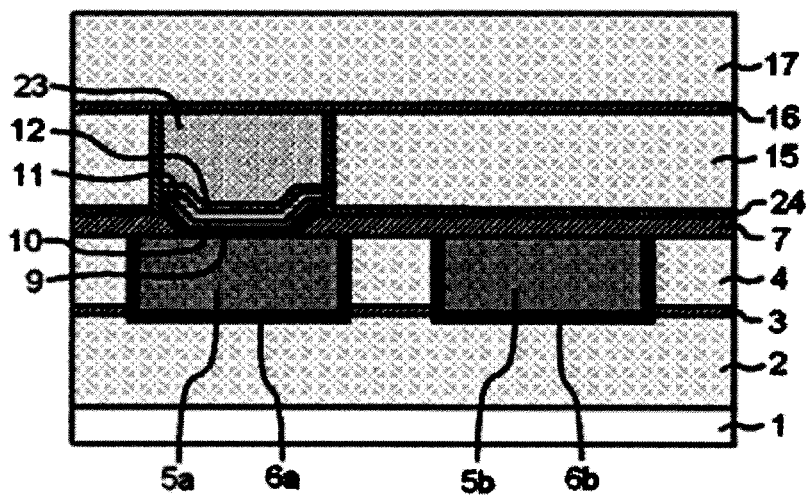

Then, on the interlayer insulation film 15, inclusive of the hard mask film 23 and the protective insulation film 24, the etching stop film 16 (e.g., a SiN film, with a film thickness of 50 nm) and the interlayer insulation film 17 (e.g., silicon oxide film, with a film thickness of 300 nm) are deposited in this order (FIG. 10B). The etching stop film 16 may, for example, be a SiN film, with its film thickness being 50 nm, and the interlayer insulation film 17 may, for example, be a silicon oxide film, with its film thickness being 300 nm. The process to form the structure shown in FIG. 10B, beginning from the structure shown in FIG. 10A, is termed a step B8.

In the step B8, the etching stop film 16 and the interlayer insulation film 17 may be deposited using the plasma CVD method.

Then, using the via-first method of the dual damascene method, the second interconnections 18a, 18b and the plugs 19a, 19b, shown in FIGS. 6A and 6B, are formed.

Figure 11A:
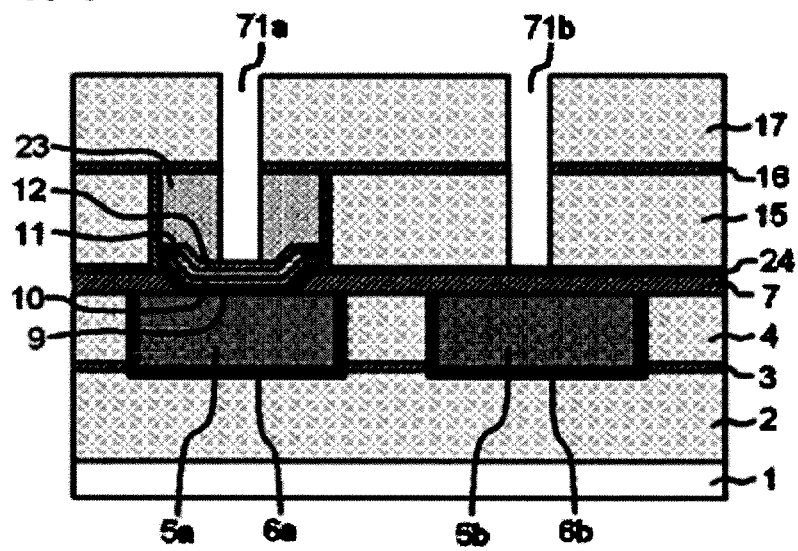
FIGS. 11A and 11B are schematic cross-sectional views, continuing from the previous figures, for illustrating the manufacturing method for the device shown in FIG. 6B.

In the via-first method, a photoresist, not shown, for forming basis holes 71a, 71b for the plugs 19a, 19b shown in FIGS. 6A and 6B, is formed on the interlayer insulation film 17. The basis hole 71a for the plug 19a, shown in FIGS. 6A and 6B, is bored in the interlayer insulation film 17, etching stop film 16 and the hard mask film 23 by dry etching, using the photoresist as mask. At the same time, the basis hole 71b for the plug 19b, shown in FIGS. 6A and 6B, is bored in the interlayer insulation film 17, etching stop film 16 and the interlayer insulation film 15. The photoresist is then removed by oxygen plasma ashing and organic stripping. FIG. 11A shows the cross-section at this time point. The process to form the structure shown in FIG. 11A, beginning from the structure shown in FIG. 10B, is termed a step B9.

In dry etching, in the step B9, the etching conditions and the etching rime are adjusted for the dry etching so that the etching will stop at the hard mask film 12 on the bottom of the basis hole 71a and at the protective insulation film 24 on the bottom of the basis hole 71b. In this case, dry etching is stopped at or inside the hard mask film 12 on the bottom of the basis hole 71a and at or inside the protective insulation film 24 on the bottom of the basis hole 71b. Hence, the basis holes 71a, 71b may be separately patterned, using different reticles, and formed using respective different etching conditions.

Figure 11B:
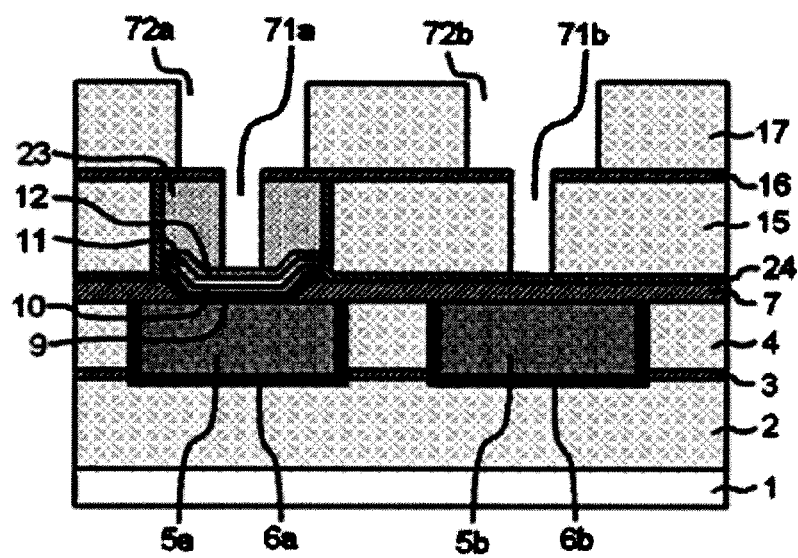

A photoresist, not shown, for forming interconnection grooves 72a, 72b for the second interconnections 18a, 18b shown in FIG. 6B, is then formed on the interlayer insulation film 17. The interconnection grooves 72a, 72b for the second interconnections 18a, 18b shown in FIG. 6B are then formed in the interlayer insulation film 17 and in the etching stop film 16 by dry etching, using the photoresist as mask. The photoresist is then removed by oxygen plasma ashing and organic stripping. FIG. 11B shows the cross-section at this time point. The process to form the structure shown in FIG. 11B, beginning from the structure shown in FIG. 11A, is termed a step B10.

In the step B10, an ARC (Anti-Reflection Coating) may be embedded on the bottoms of the basis holes 71a, 71b to prevent punch-through at the bottoms of the basis holes 71a, 71b.

In the step B10, the bottoms of the basis holes 71a, 71b are protected by the hard mask film 12 and the protective insulation film 24. Hence, these bottoms may be protected against oxidation damages otherwise caused by oxygen plasma ashing.

The hard mask film 12 on the bottom of the basis hole 71a is then etched, while the protective insulation film 24 and the insulation barrier film 7 on the bottom of the basis hole 71b are also etched. This exposes the second upper electrode 11 from the basis hole 71a, while exposing the first interconnection 5b from the basis hole 71b. The second interconnections 18a, 18b (such as Cu) and the plugs 19a, 19b (such as Cu) are formed simultaneously, via barrier metal layers 20a, 20b, in the interconnection grooves 72a, 72b and in the basis holes 71a, 71b, respectively. The barrier metal layers may, for example, be Ta films with a film thickness of 5 nm. An insulation barrier film 21, such as SiN film, is then deposited on the interlayer insulation film 17, inclusive of the second interconnections 18a, 18b, to finish the structure shown in FIG. 6B. The process to form the structure shown in FIGS. 6A and 6B, beginning from the structure shown in FIG. 11B, is termed a step B11.

In the step B11, the second interconnections 18a, 18b may be formed using the process similar to that of forming the low-layer interconnection. It is preferred that the bottom diameter of the plug 19a is smaller than the opening diameter of the insulation barrier film 7. In the present exemplary embodiment, the diameter of the bottom part of the plug 19a is 240 nm and that at the opening of the insulation barrier film 7 is 400 nm, for example. The width of the first interconnection 5a, also serving as the lower electrode of the variable resistance element 25, is preferably larger than the opening diameter of the insulation barrier film 7. Additionally, the barrier metal layer 20a and the second upper electrode 11 may be of the same material to reduce the contact resistance between the plug 19a and the second upper electrode 11 to improve the performance of the variable resistance element (to reduce the resistance of the variable resistance element 25 at ON-time).

EXAMPLES

Example 1

In the present Example 1, the structure and the electrical characteristic of the variable resistance element manufactured by the method explained in the exemplary embodiment 4 will be described. As an organic silica starting feedstock material, the material having the structure shown by the chemical formula 5 was used.

As the conditions for forming an insulation film, which is to be the ion conduction layer, a flow rate of the starting feedstock material=40 sccm, a He gas flow rate=1500 sccm, a pressure of 3.5 Torr and a RF power=88 W were used. The time of plasma application was set so that the film thickness of the as-grown insulation film was 6 nm.

The composition of the insulation film was Si:O:C=1:1: 2.7, while its dielectric constant was 2.5.

It is noted that the composition of the insulation film may be arbitrarily changed to adjust the variable resistance element to a desired operating characteristic. For example, by decreasing the amount of the starting feedstock material supplied and increasing the He gas flow rate, in addition to varying the RF power, it is possible to decrease the amount of C further, while the Si/O ratio is maintained, such as to control the C/Si ratio in a range from 2.0 to 3.0. Moreover, the film composition may appropriately be changed by changing the composition of the organic silica starting feedstock material in advance.

The cross-section of the variable resistance element, produced by the method explained in the exemplary embodiment 4, was observed with the TEM. It was confirmed that a titanium oxide film and a porous film were directly deposited on the upper copper surface.

Example 2

The organic siloxane starting feedstock materials, shown in the chemical formulas 3 to 9, were evaluated as to their performance as the ion conduction layer. The variable resistance elements were formed using the method explained in the exemplary embodiment 4. However, no detailed description herein is made in order to avoid redundancy.

The amount of the starting feedstock material was set constant at 40 sccm regardless of the sorts of the materials. As for the other processing conditions, the He gas flow rate was set at 1500 sccm, the pressure was 3.5 Torrs and the RF power was set at 88 W. Since the film growth rate varied with the sorts of the feedstock materials, the plasma application time was controlled so that the film thickness of the as-grown insulation film might be 6 nm. In case the starting feedstock materials of the chemical formulas 6, 7 or 8 were used, the film growth rate was lowered appreciably. Thus, in these cases, the RF power was increased to 150 W.

In case the films were formed using the chemical formulas 3 to 10 as the starting feedstock materials, the dielectric constant was lowered in case a vinyl group was attached to the side chain or in case the starting feedstock material with the six-membered ring was used. It was confirmed that, in case of using the chemical formula 5, the intra-film carbon concentration was highest, with the dielectric constant decreasing correspondingly. In case of using each of these films as the ion conduction layer, an on/off operation could be confirmed at a voltage not higher than 5V in the 'sweep' measurement. In case of forming the films from these starting feedstock materials by the plasma CVD method, the dielectric constant of the films ranged between 2.5 and 3.5, thus testifying to their excellent switching performance.

Although the present disclosure has been described with reference to preferred exemplary embodiments and Examples, these are for illustrating the present disclosure based on practical cases and are not intended to limit the present disclosure.

The manufacturing technique for a semiconductor, having the CMOS circuit, as the field of use of the present disclosure, has been described in detail, and a case of forming the variable resistance element on top of the copper interconnection in the semiconductor substrate has also been described in detail, only by way of illustration. The present disclosure may be applied to, for example, semiconductor products having DRAMs (Dynamic RAMs), SRAMs (Static RAMs), flash memories, FRAMs (Ferro Electric RAMs), MRAMs (Magnetic RAMs), variable resistance memories or memory circuits including bipolar transistors, or to semiconductor products provided with logic circuits such as microprocessors. The present disclosure may also be applied to copper interconnections of boards or packages loaded with these semiconductor products in combination.

The present disclosure may also be applied to the connection to semiconductor devices of electronic circuit devices, optical circuit devices, quantum-circuit devices, micro-machines or MEMS (Micro Electro Mechanical Systems). While the description of the present disclosure has been centered about Examples relating to switching functions, the present disclosure may also be used for memory devices that make use of both the non-volatile and resistance change characteristics.

The method for connecting to a substrate according to the present disclosure may be checked in the as-manufactured state. Specifically, the cross-section of the device may be observed with the TEM to identify the lower electrode, ion conduction layer or the upper electrode formed of copper. In addition, it may be checked that copper interconnection is used in multilevel interconnections. In case a variable resistance element is used, such use may be confirmed by checking for the presence of the ion conduction layer in a state in which the lower surface of the variable resistance element is the copper interconnection, which copper interconnection also serves as the lower electrode. The type of the material used may also be confirmed by composition analysis by EDX (Energy Dispersive X-ray Spectroscopy) or EELS (Electron Energy-Loss Spectroscopy) besides TEM. Specifically, it may be determined whether or not the ion conduction layer formed on the copper interconnection is a film containing both oxygen and carbon. If in addition, the upper electrode in contact with the ion conduction layer is Ru, it may be determined that the film uses the structure according to the present disclosure.

Although the description has been made of preferred exemplary embodiments and examples of the present disclosure, such exemplary embodiments and examples are given only by way of illustration and are not intended to limit the scope of the present disclosure. The structures and details of the present disclosure are changeable in various manners that the person skilled in the art can understand within the scope of the present disclosure. The particular exemplary embodiments or examples may be modified or adjusted within the scope of the entire disclosure of the present disclosure, inclusive of claims and the drawings, based on the fundamental technical concept of the disclosure. Further, a variety of combinations or selection of elements disclosed herein may be made within the context of the claims. Viz., the present disclosure may cover a wide variety of modifications or corrections that may occur to those skilled in the art in accordance with the entire disclosure of the present disclosure, inclusive of claim and the technical concept of the present disclosure.

| REFERENCE SIGNS LIST | |
|---|---|
| 1 | semiconductor substrate |
| 2 | interlayer insulation film |
| 3 | barrier insulation film |
| 4 | interlayer insulation film |
| 5a, 5b | first interconnections |
| 6a, 6b | barrier metal |
| 7 | insulation barrier film |
| 8 | titanium oxide film |
| 9 | ion conduction layer (porous film) |
| 10 | first upper electrode |
| 11 | second upper electrode |
| 12 | hard mask film |
| 15 | interlayer insulation film |
| 16 | etching stop film |
| 17 | interlayer insulation film |
| 18a, 18b | second interconnections |
| 19a, 19b | plugs |
| 20a, 20b | barrier metal layers |
| 21 | insulation barrier film |
| 23 | hard mask film |
| 24 | protective insulation film |
| 25 | variable resistance element |
| 71a, 71b | basis holes |
| 72a, 72b | interconnection grooves |
| 101, 110 | first electrodes |
| 102a | first ion conduction layer (porous film) |
| 102b | second ion conduction layer (porous film) |
| 103, 114 | second electrodes |
| 112 | titanium oxide film |
| 112a | titanium film |
| 113 | ion conduction layer (porous film) |
| 113a | ion conduction layer with high carbon concentration |
| 113b | ion conduction layer with low carbon concentration |
| 114 | second electrode |
| 500 | memory cell array |
| 530 | memory cell |
| 531 | variable resistance element |
| 533, 543 | transistors |

What is claimed is:

1. A variable resistance element, comprising:
   first and second electrodes; and
   an ion conduction layer interposed between the first and second electrodes; wherein, the ion conduction layer contains an organic oxide containing at least oxygen and carbon;
a carbon concentration distribution in the ion conduction layer being such that the carbon concentration in an area of the ion conduction layer closer to the first electrode is greater than that in an area thereof closer to the second electrode.

2. The variable resistance element according to claim 1, wherein,
the carbon concentration distribution in the ion conduction layer decreases continuously or stepwise from the area on the first electrode side towards the area on the second electrode side.

3. The variable resistance element according to claim 1, wherein,
the ion conduction layer is a film containing at least silicon as element in addition to oxygen and carbon.

4. The variable resistance element according to claim 3, wherein,
the ion conduction layer is a film containing an organic matter including a six-membered or eight-membered siloxane structure as a main skeleton.

5. The variable resistance element according to claim 4, wherein,
the organic matter further includes at least an unsaturated hydrocarbon group.

6. The variable resistance element according to claim 1, wherein
the ion conduction layer is a porous film.

7. The variable resistance element according to claim 1, wherein
the ion conduction layer has a dielectric constant not less than 2.5 and not greater than 3.5.

8. The variable resistance element according to claim 1, wherein
the material of the first electrode comprises copper.

9. The variable resistance element according to claim 8, further comprising:
a titanium oxide layer interposed between the ion conduction layer and copper of the first electrode, the ion conduction layer containing titanium.

10. A method for manufacturing a variable resistance element having a layered structure of a first electrode, an ion conduction layer containing an organic oxide, and a second electrode, layered in this order, comprising:
a plasma CVD process for forming the ion conduction layer containing the organic oxide, the plasma CVD process employing a vapor of an organic silica compound and an inert gas for dilution, the organic silica compound including a skeleton composed by at least silicon, carbon and oxygen; wherein
the plasma CVD process includes varying, either continuously or stepwise, the high frequency power for plasma initiation or the partial pressure of the vapor of the organic silica compound supplied, as from a time of plasma ignition.

11. The method according to claim 10, wherein
the organic silica compound is a cyclic organic silica compound including a skeleton composed by silicon, carbon and oxygen.

12. The method according to claim 10, wherein
the organic silica compound is a cyclic organic silica compound including a skeleton composed by silicon, carbon and oxygen, with at least one unsaturated hydrocarbon group attached to its side chain.

13. A variable resistance element, comprising:
first and second electrodes; and
an ion conduction layer interposed between the first and second electrodes; wherein,
the ion conduction layer contains an organic oxide containing at least oxygen and carbon;
a carbon concentration distribution in the ion conduction layer being such that the carbon concentration in an area of the ion conduction layer closer to the first electrode is greater than that in an area thereof closer to the second electrode;
the carbon concentration distribution in the ion conduction layer decreases continuously or stepwise from the area on the first electrode side towards the area on the second electrode side: and
the ion conduction layer is a film containing at least silicon as element in addition to oxygen and carbon.

14. The variable resistance element according to claim 13, wherein,
the ion conduction layer is a film containing an organic matter including a six-membered or eight-membered siloxane structure as a main skeleton.

15. The variable resistance element according to claim 14, wherein,
the organic matter further includes at least an unsaturated hydrocarbon group.

16. The variable resistance element according to claim 14, wherein
the ion conduction layer is a porous film.

17. The variable resistance element according to claim 13, wherein
the ion conduction layer is a porous film.

18. The variable resistance element according to claim 13, wherein
the ion conduction layer has a dielectric constant not less than 2.5 and not greater than 3.5.

19. The variable resistance element according to claim 13 wherein
the material of the first electrode comprises copper.

20. The variable resistance element according to claim 19, further comprising:
a titanium oxide layer interposed between the ion conduction layer and copper of the first electrode, the ion conduction layer containing titanium.

* * * * *